US012266602B2

(12) United States Patent
Lin et al.

(10) Patent No.: US 12,266,602 B2
(45) Date of Patent: Apr. 1, 2025

(54) INTEGRATED CIRCUIT STRUCTURE AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Shih-Yen Lin, New Taipei (TW); Yu-Wei Zhang, Hualien County (TW); Kuan-Chao Chen, Tainan (TW); Si-Chen Lee, Taipei (TW); Chi Chen, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 498 days.

(21) Appl. No.: 17/572,160

(22) Filed: Jan. 10, 2022

(65) Prior Publication Data
US 2023/0014503 A1 Jan. 19, 2023

Related U.S. Application Data

(60) Provisional application No. 63/222,792, filed on Jul. 16, 2021.

(51) Int. Cl.
*H01L 23/522* (2006.01)
*H01L 21/768* (2006.01)
*H01L 29/66* (2006.01)

(52) U.S. Cl.
CPC .... *H01L 23/5226* (2013.01); *H01L 21/76802* (2013.01); *H01L 21/76843* (2013.01); *H01L 29/66545* (2013.01)

(58) Field of Classification Search
CPC .......... H01L 23/5226; H01L 21/76802; H01L 21/76843; H01L 21/2855; H01L 21/76877;
(Continued)

(56) References Cited

U.S. PATENT DOCUMENTS

2002/0086523 A1* 7/2002 Barth .................. H01L 23/5226
257/E21.582
2002/0105082 A1* 8/2002 Andricacos ....... H01L 21/76877
257/E21.585

(Continued)

OTHER PUBLICATIONS

K. S. Novoselov et al., "Electric Field Effect in Atomically Thin Carbon Films", Science, vol. 306, Oct. 22, 2004, pp. 666-669.
(Continued)

*Primary Examiner* — Galina G Yushina
(74) *Attorney, Agent, or Firm* — Maschoff Brennan

(57) ABSTRACT

A method includes forming an interlayer dielectric (ILD) layer over a transistor; forming a first inter-metal dielectric (IMD) layer over the ILD layer; etching a via opening extending through the first IMD layer; forming a first 2-D material layer lining along sides and a bottom of the via opening; depositing a first metal in the via opening and over the first 2-D material layer; performing a chemical mechanism polishing (CMP) process to the first metal until the first IMD layer is exposed; forming a second IMD layer over the first IMD layer; etching a trench in the second IMD layer; forming a second 2-D material layer lining along sides and a bottom of the trench; and depositing a second metal over the second 2-D material layer at a temperature lower than a temperature of depositing the first metal over the first 2-D material layer.

20 Claims, 30 Drawing Sheets

(58) Field of Classification Search
CPC .............. H01L 29/66545; H01L 23/485; H01L 23/53238; H01L 23/53252; H01L 29/66969; H01L 29/778; H01L 29/24
See application file for complete search history.

(56) References Cited

U.S. PATENT DOCUMENTS

| | | | | |
|---|---|---|---|---|
| 2012/0329273 | A1* | 12/2012 | Bruce | H01L 21/3105 438/653 |
| 2014/0367857 | A1* | 12/2014 | Yang | H01L 21/76849 438/653 |
| 2017/0121843 | A1* | 5/2017 | Plummer | C30B 29/02 |
| 2019/0242028 | A1* | 8/2019 | Ruoff | C30B 29/02 |
| 2020/0194376 | A1* | 6/2020 | Naylor | H01L 29/45 |

OTHER PUBLICATIONS

Chong-Rong Wu et al., "Multilayer MoS2 prepared by one-time and repeated chemical vapor depositions: anomalous Raman shifts and transistors with high On/Off ratio", Journal of Physics D: Applied Physics, Sep. 29, 2015, vol. 48, No. 43.

Meng-Yu Lin et al., "The growth mechanisms of graphene directly on sapphire substrates by using the chemical vapor deposition", Journal of Applied Physics, vol. 115, 223510, Jun. 11, 2014.

Meng-Yu Lin et al., "Toward epitaxially grown two-dimensional crystal hetero-structures: Single and double MoS2/graphene hetero-structures by chemical vapor depositions", Applied Physics Letters, vol. 105, 073501, Aug. 18, 2014.

Chong-Rong Wu et al., "The Establishment of 2D Crystal Hetero-structures By Sulfurization of Sequential Transition Metal Depositions: Preparation, Characterization and Selective Growth", Nano Letters, Oct. 20, 2016, vol. 16, pp. 7093-7097.

Kuan-Chao Chen et al., "Layer number controllability of transition-metal dichalcogenides and the establishment of hetero-structures by using sulfurization of thin transition metal films", Journal of Physics D Applied Physics, Feb. 2017, vol. 50, 064001.

Kuan-Chao Chen et al., "Current Enhancement and Bipolar Current Modulation of Top-Gate Transistors Based on Monolayer MoS2 on Three-Layer WxMo1—xS2", ACS Appl. Mater. Interfaces, Jul. 3, 2018, vol. 10, pp. 24733-24738.

Naveen K. Mahenderkar et al., "Epitaxial lift-off of electrodeposited single-crystal gold foils for flexible electronics", Science, vol. 355, Mar. 17, 2017, pp. 1203-1206.

* cited by examiner

INTEGRATED CIRCUIT STRUCTURE AND METHOD FOR FORMING THE SAME

PRIORITY CLAIM AND CROSS-REFERENCE

The present application claims priority to U.S. Provisional Application Ser. No. 63/222,792, filed Jul. 16, 2021, which is herein incorporated by reference.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
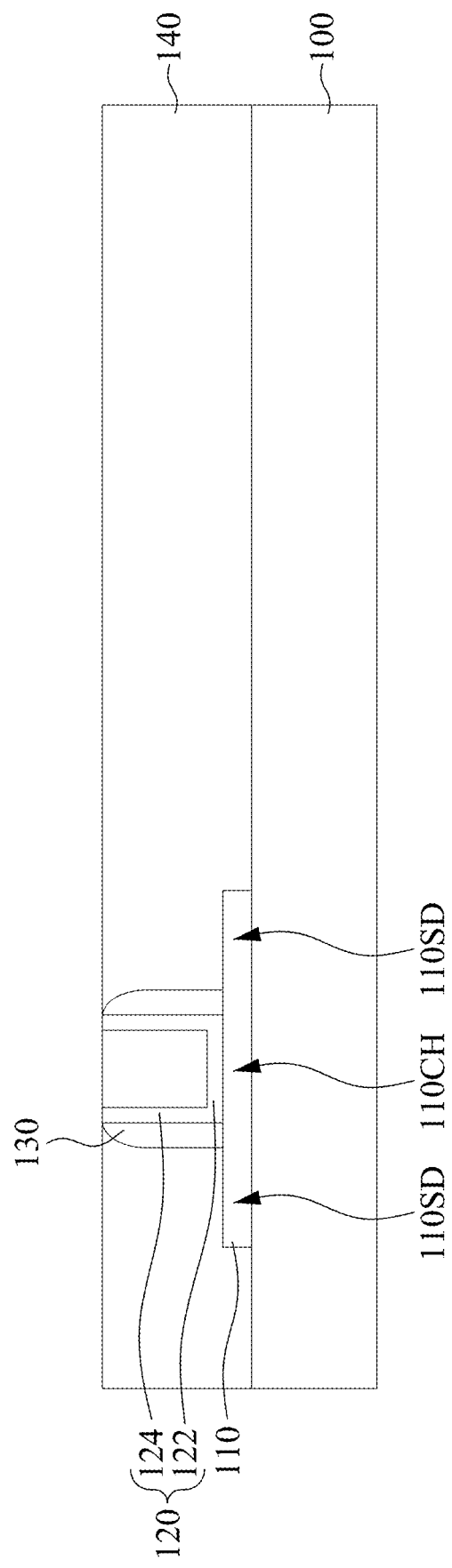
FIGS. 1A, 2, 3, 4, 5, 6A, 7, 13, 14, 15, 16, 17, and 18 are cross-sectional views of an integrated circuit structure in various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

2-D materials with similar compositions (e.g., $MoS_2$ and $WS_2$) can be epitaxially stacked with each other to form hetero-structures without alloys observed after the growth. This phenomenon indicates that the nature of van der Waals epitaxy is that the stacking of different materials is through van der Waals force instead of chemical bonds, which is different from traditional epitaxy technique. Despite the different lattice constants between the upper 2-D materials to the underneath 2-D material surface, the successful demonstrations of different vertical 2-D material hetero-structures have revealed that in van der Waals epitaxy, the epi-layers are less dependent to the underneath layer. This phenomenon is different from traditional semiconductor epitaxy techniques such as MBE and MOCVD. The adhesion between different 2-D materials through van der Waals forces instead of chemical bonds brings possibility of epitaxially grown hetero-structures with large lattice constant mismatches. With the different mono- and hetero- 2-D material epi-layers grown onto each other, the results show that the materials tend to have 2-D material structures on a 2-D material surface. For example, different group-IV elements, such as germanium and tin, are deposited onto $MoS_2$ surfaces. From the HRTEM images, well-stacked multi-layer germanene and stanene are observed on $MoS_2$ surfaces. The results have again demonstrated that the lattice mismatch on the hetero-structure interfaces does not limit the van der Waals epitaxy of 2-D material hetero-structures. On the other hand, the observations of the three elemental 2-D materials instead of their semiconductor structures on $MoS_2$ surfaces suggest the preferential 2-D structure formation onto 2-D material surface.

Inspired by the successful demonstrations of 2-D materials grown on 2-D material surface, embodiments of the present disclosure further provides a method about growing other crystals on 2-D material surfaces through the van der Waals epitaxy, as described in greater detail below.

FIGS. 1A, 2, 3, 4, 5, 6A, 7, 13, 14, 15, 16, 17, and 18 are cross-sectional views of an integrated circuit structure in various stages of fabrication in accordance with some embodiments of the present disclosure. Although the views shown in FIGS. 1-7 and 13-18 are described with reference to a method, it will be appreciated that the structures shown in FIGS. 1-7 and 13-18 are not limited to the method but rather may stand alone separate of the method. Although FIGS. 1-7 and 13-18 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Reference is made to FIG. 1A. Shown there is a substrate 100. In some embodiments, the substrate 100 may function to provide mechanical and/or structure support for features or structures that are formed in the subsequent steps of the process flow illustrated in FIGS. 1-7 and 13-18. These features or structures may be parts or portions of a semiconductor device (e.g. a transistor) that may be formed on or over the substrate 100.

Generally, the substrate 100 illustrated in FIG. 1A may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates. In some other embodiments, the substrate 100 may include sapphire (e.g. crystalline $Al_2O_3$), e.g. a large grain or a single crystalline layer of sapphire or a coating of sapphire. As another example, the substrate 100 may be a sapphire substrate, e.g. a transparent sapphire substrate comprising, as an example, $\alpha$-$Al_2O_3$. Other elementary semiconductors like germanium may also be used for substrate 100.

A 2-D material layer 110 is formed over the substrate 100. In some embodiments, the 2-D material layer 110 is in direct contact with the top surface of the substrate 100. As used herein, consistent with the accepted definition within solid state material art, a "2-D material" may refer to a crystalline material consisting of a single layer of atoms. As widely accepted in the art, "2-D material" may also be referred to as a "monolayer" material. In this disclosure, "2-D material" and "monolayer" material are used interchangeably without differentiation in meanings, unless specifically pointed out otherwise. The 2-D material layer 110 may be 2-D materials of suitable thickness. In some embodiments, a 2-D material includes a single layer of atoms in each of its monolayer structure, so the thickness of the 2-D material refers to a number of monolayers of the 2-D material, which can be one monolayer or more than one monolayer. The coupling between two adjacent monolayers of 2-D material includes van der Waals forces, which are weaker than the chemical bonds between/among atoms within the single monolayer.

In some embodiments, the 2-D material layer 110 may be 2-D semiconductor materials, which are usually few-layer thick and exist as stacks of strongly bonded layers with weak interlayer van der Waals attraction, allowing the layers to be mechanically or chemically exfoliated into individual, atomically thin layers. The 2-D semiconductor materials are promising candidates of the channel, source, drain materials of transistors. Examples of 2-D semiconductor materials include transition metal dichalcogenides (TMDs), graphene, layered III-VI chalcogenide, hexagonal Boron Nitride (h-BN), black phosphorus or the like. The 2-D semiconductor may include one or more layers and can have a thickness within the range of about 0.5-100 nm in some embodiments. One advantageous feature of the few-layered 2-D semiconductor is the high electron mobility value.

Figure 1B:
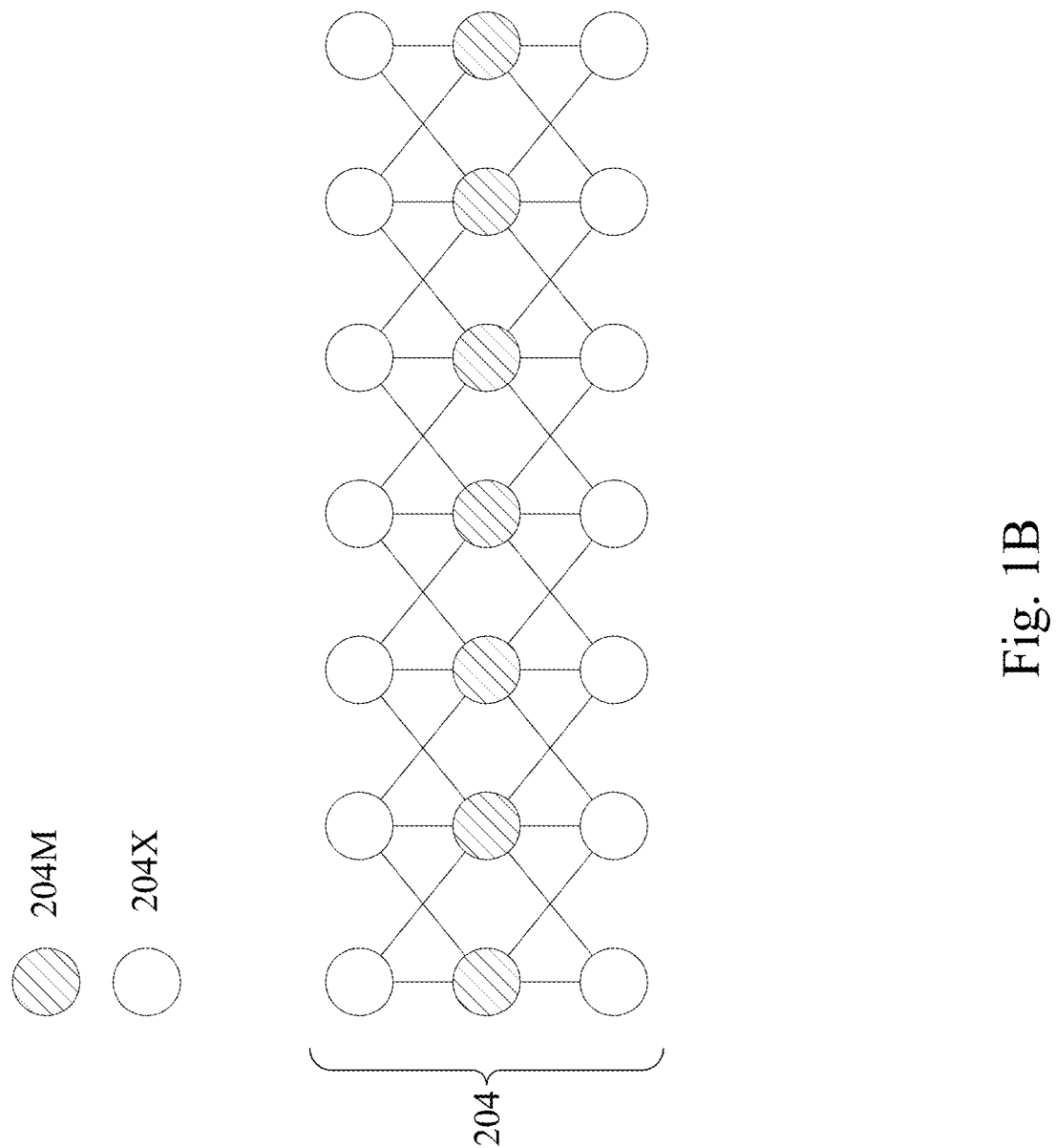
FIGS. 1B and 6B are schematic views of a mono-layer of an example TMD in accordance with some embodiments of the present disclosure.

FIG. 1B illustrates a schematic view of a mono-layer 204 of an example TMD in accordance with some example embodiments. In FIG. 1B, the one-molecule thick TMD material layer comprises transition metal atoms 204M and chalcogen atoms 204X. The transition metal atoms 204M may form a layer in a middle region of the one-molecule thick TMD material layer, and the chalcogen atoms 204X may form a first layer over the layer of transition metal atoms 204M, and a second layer underlying the layer of transition metal atoms 204M. The transition metal atoms 204M may be W atoms or Mo atoms, while the chalcogen atoms 204X may be S atoms, Se atoms, or Te atoms. In the example of FIG. 1B, each of the transition metal atoms 204M is bonded (e.g. by covalent bonds) to six chalcogen atoms 204X, and each of the chalcogen atoms 204X is bonded (e.g. by covalent bonds) to three transition metal atoms 204M. Throughout the description, the illustrated cross-bonded layers including one layer of transition metal atoms 204M and two layers of chalcogen atoms 204X in combination are referred to as a mono-layer 204 of TMD.

Formation of the 2-D material layer 110 may include suitable processes depending on the 2-D material layer 110 and the substrate 100. In some embodiments, the 2-D material layer 110 includes a transition metal dichacogenide (TMD) monolayer material. In some embodiments, a TMD monolayer includes one layer of transition metal atoms sandwiched between two layers of chalcogen atoms. Substrate 100 may include any substrates that are suitable for the formation of the TMD monolayers thereover. For example, substrate 100 may be selected based on its capacity to sustain the potential high temperature in the formation of the TMD monolayers thereover.

In some embodiment where the 2-D material layer 110 includes TMD monolayers, the TMD monolayers include molybdenum disulfide ($MoS_2$), tungsten disulfide ($WS_2$), tungsten diselenide ($WSe_2$), or the like. In some embodiments, $MoS_2$ and $WS_2$ may be formed on the substrate 100, using suitable approaches. For example, $MoS_2$ and $WS_2$ may be formed by micromechanical exfoliation and coupled over the substrate 100, or by sulfurization of a pre-deposited molybdenum (Mo) film or tungsten (W) film over the substrate 100. In alternative embodiments, $WSe_2$ may be formed by micromechanical exfoliation and coupled over the substrate 100, or by selenization of a pre-deposited tungsten (W) film over the substrate 100 using thermally cracked Se molecules.

In some other embodiments where $MoS_2$ is formed by micromechanical exfoliation, the 2-D material layer 110 is formed on another substrate and then transferred to the substrate 100. For example, a 2-D material film is formed on a first substrate by chemical vapor deposition (CVD), sputtering or atomic layer deposition in some embodiments. A polymer film, such as poly(methyl methacrylate) (PMMA), is subsequently formed on the 2-D material film. After forming the polymer film, the sample is heated, such as by placing the sample on a hot plate. Subsequent to heating, a corner of the 2-D material film is peeled off the first substrate, such as by using a tweezers, and the sample is submerged in a solution to facilitate the separation of the 2-D material film from the first substrate. The 2-D material film and polymer film are transferred to the substrate 100. The polymer film is then removed from the 2-D material film using a suitable solvent.

In some embodiments where $MoS_2$ is formed by sulfurizing a pre-deposited molybdenum (Mo) film over the substrate 100, a Mo film may be deposited over the substrate 100, by suitable process, such as using RF sputtering with a molybdenum target to form the Mo film on the substrate 100. After the Mo film is deposited, the substrate 100 as well as the Mo film are moved out of the sputtering chamber and exposed to air. As a result, the Mo film will be oxidized and form Mo oxides. Then, the sample is placed in the center of a hot furnace for sulfurization. During the sulfurization procedure, Ar gas is used as a carrier gas with the S powder placed on the upstream of the gas flow. The S powder is heated in the gas flow stream to its evaporation temperature. During the high-temperature growth procedure, the Mo oxide segregation and the sulfurization reaction will take place simultaneously. If the background sulfur is sufficient, the sulfurization reaction will be the dominant mechanism. Most of the surface Mo oxides will be transformed into $MoS_2$ in a short time. As a result, a uniform planar $MoS_2$ film will be obtained on the substrate after the sulfurization procedure. With this process, the 2-D material layer 110 can be uniformly formed on a large-area of the substrate 100.

In some embodiments, forming of the 2-D material layer 110 also includes treating the 2-D material layer 110 to obtain expected electronic properties of the 2-D material layer 110. The treating processes include thinning (namely, reducing the thickness of the 2-D material layer 110), doping, or straining, to make the 2-D material layer 110 exhibit certain semiconductor properties, e.g., including direct bandgap. The thinning of the 2-D material layer 110 may be achieved through various suitable processes, and all are included in the present disclosure. For example, plasma based dry etching, e.g., reaction-ion etching (RIE), may be used to reduce the number of monolayers of the 2-D material layer 110. In the description hereinafter, the 2-D material layer 110 may include semiconductor properties (interchangeably referred to as semiconductive 2-D material layer in this context). In some embodiments, each monolayer of $MoS_2$ is about 6.5 angstrom (Å) to about 7.5 Å in thickness (e.g., 7.0 Å) in thickness. In some embodiments, the thickness of the $MoS_2$ 2-D material layer 110 is in a range from about 0.7 nm to about 7 nm, namely about 1 to about 10 monolayers of $MoS_2$. In some embodiments, each monolayer of $WSe_2$ is about 6.5 angstrom (Å) to about 7.5 Å in thickness (e.g., 7.0 Å) in thickness. In some embodiments, the thickness of the $WSe_2$ 2-D material layer 110 is in a range from about 0.7 nm to about 7 nm, namely about 1 to about 10 monolayers of $WSe_2$.

In some embodiments, the 2-D material layer 110 may be patterned to cover a portion of the top surface of the substrate 100, while leaving other portions of the top surface of the substrate 100 exposed by the 2-D material layer 110. The 2-D material layer 110 may be patterned by suitable photolithography process, such as forming a patterned photoresist having openings exposing unwanted portions of the 2-D material layer 110, and etching away the unwanted portions of the 2-D material layer 110 to expose the substrate 100.

A gate structure 120 is formed over a channel region 110CH of the 2-D material layer 110. In some embodiments, the gate structure 120 includes a gate dielectric layer 122 and a gate electrode 124 over the gate dielectric layer 122. In some embodiments, the gate structure 120 illustrated in FIG. 1A may be a high-k metal gate (HKMG) gate structure that may be formed using a gate-last process flow. In a gate last process flow, a sacrificial dummy gate structure (not shown) is formed. The dummy gate structure may include a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. As described in greater detail below, the dummy gate structure may be replaced by the HKMG gate structure 120 as illustrated in FIG. 1A.

Spacers 130 are formed, for example, aligned to the dummy gate structures. Spacers 130 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 130 along the sidewalls of the dummy gate structures.

The 2-D material layer 110 also includes source/drain regions 110SD on opposite sides of the channel region 110CH. In some embodiments, the source/drain regions 110SD are doped regions in the 2-D material layer 110. In some embodiments, the source/drain regions 110SD may comprise heavily-doped regions and relatively lightly-doped drain extensions, or LDD regions. Generally, the heavily-doped regions are spaced away from the gate structure 120 by the spacers 130, whereas the LDD regions may be formed prior to forming spacers 130 and, hence, extend under the spacers 130 and, in some embodiments, extend further into 2-D material layer 110 below the gate structure 120. These doped regions may be formed, for example, by implanting n-type or p-type dopants (e.g., As, P, B, In, or the like) into source/drain regions 110SD of the 2-D material layer 110 by using an ion implantation process, except for channel region 110CH of the 2-D material layer 110 directly below the gate structure 120; or by first depositing a dopant source layer over source/drain regions of the 2-D material layer 110 and then diffusing dopants from the dopant source layer into the 2-D material layer 110 by annealing. Accordingly, the gate structure 120, the channel region 110CH of the 2-D material layer 110, and the source/drain 110SD of the 2-D material layer 110 may collectively work as a transistor.

A first interlayer dielectric (ILD) 140 is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer 140. The HKMG gate structures 120 may then be formed by first removing the dummy gate structures using one or more etching techniques, thereby creating trenches between respective spacers 130. Next, a replacement gate dielectric layer 122 comprising one more dielectrics, followed by a replacement conductive gate electrode 124 comprising one or more conductive materials, are deposited to completely fill the recesses. Excess portions of the gate dielectric layer 122 and gate electrode 124 may be removed from over the top surface of first ILD layer 140 using, for example a CMP process. The resulting structure, as illustrated in FIG. 1A, may be a substantially coplanar surface comprising an exposed top surface of first ILD layer 140, spacers 130, and remaining portions of the HKMG gate structure 120 inlaid between respective spacers 130.

The gate dielectric layer 122 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the gate electrode 124 may be a multilayered metal gate stack comprising a barrier layer, a work function layer, and a gate-fill layer formed successively on top of gate dielectric layer 122. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may include metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

Figure 2:
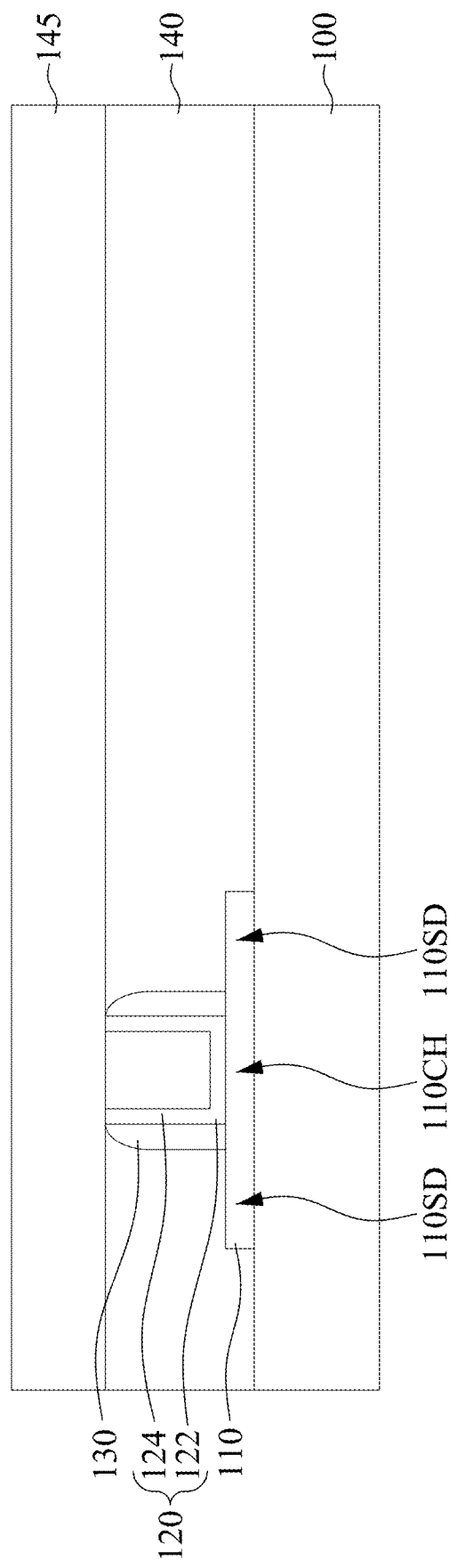

Reference is made to FIG. 2. A second ILD layer 145 may be deposited over the first ILD layer 140. In some embodiments, the insulating materials to form the first ILD layer 140 and the second ILD layer 145 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 140 and the second ILD layer 145 may be deposited using any suitable method, such as CVD, physical vapor deposition (PVD), ALD, PEALD, PECVD, SACVD, FCVD, spin-on coating, and/or the like, or a combination thereof.

Figure 3:
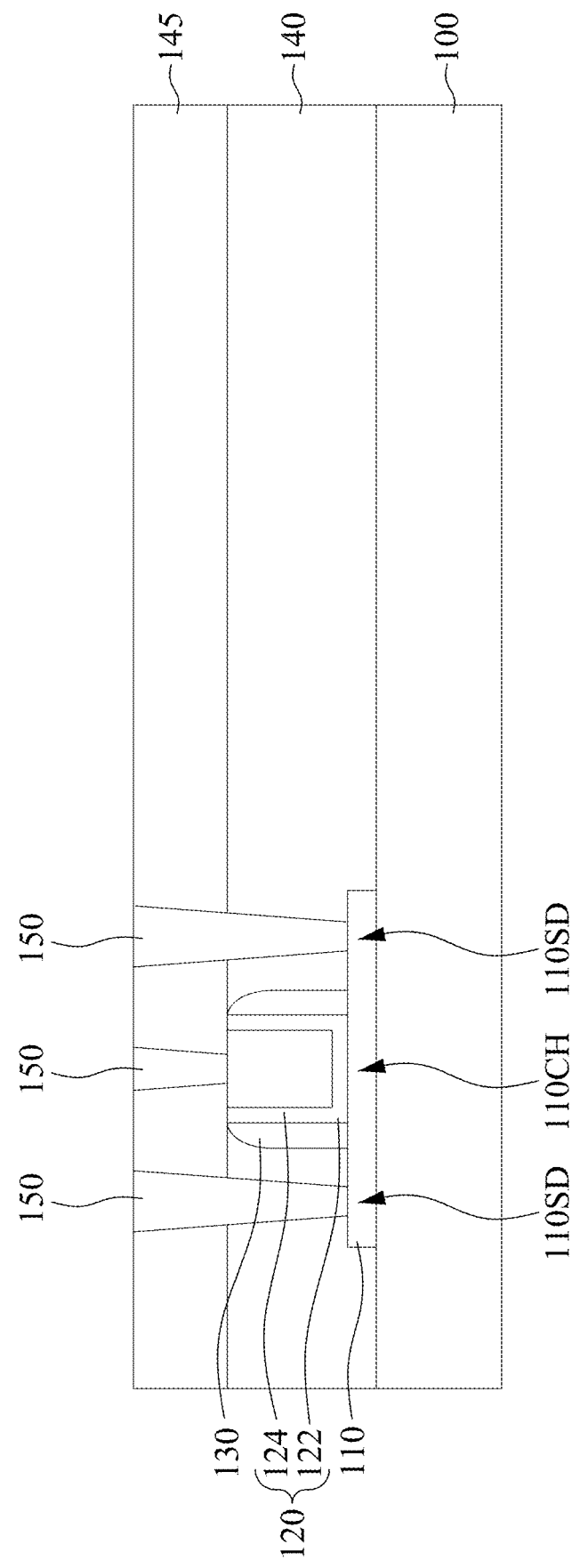
Figure 18:
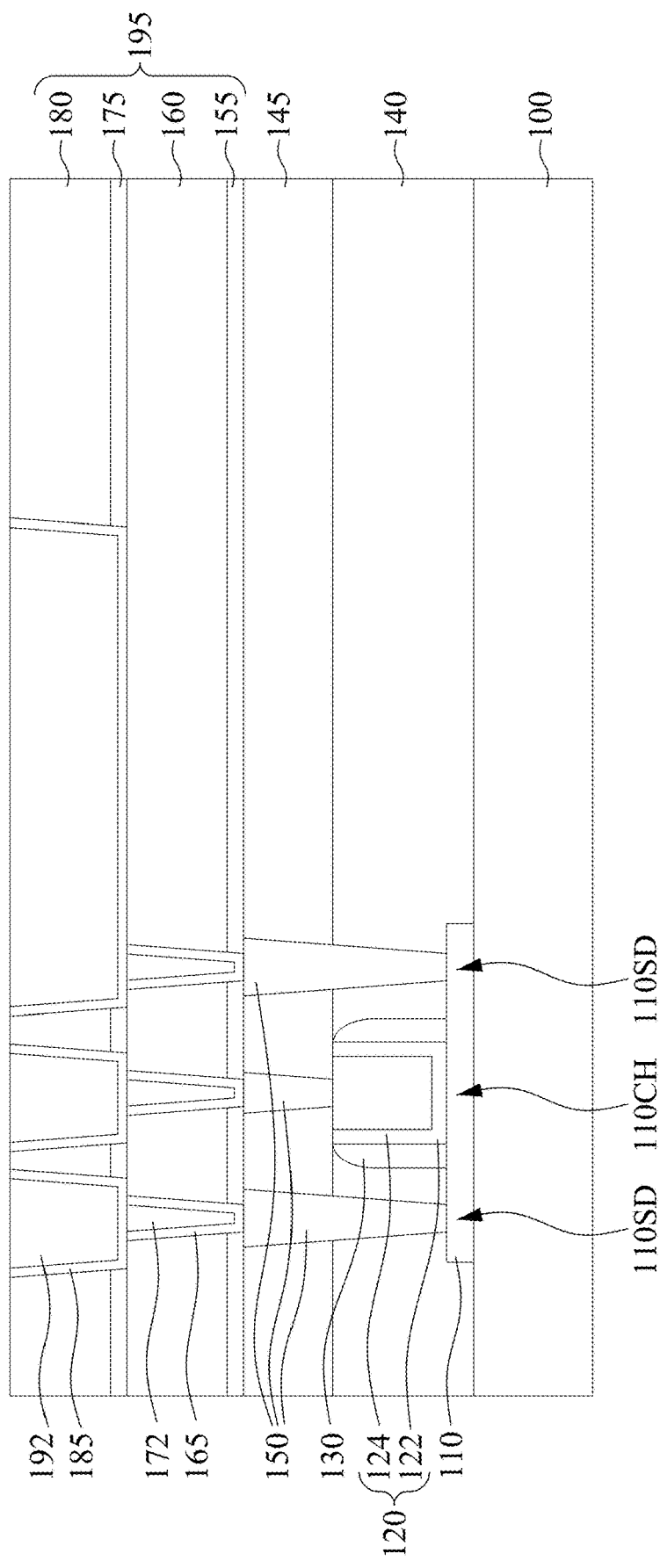

Reference is made to FIG. 3. Contacts 150 are formed to make electrical connections to the gate structure 120 and the source/drain regions 110SD of the 2-D material layer 110. The contacts 150 formed on the source/drain regions 110SD of the 2-D material layer 110 can be referred to as source/drain contacts, and the contact 150 formed on the gate structure 120 can be referred to as gate contact. The gate contacts and source/drain contacts can be referred to as middle-end-of-line (MEOL) conductive features that electrically connect front-end-of-line (FEOL) conductive features (for example, gate structures 120 and/or source/drain regions 110SD of the 2-D material layer 110) to back-end-of-line (BEOL) conductive features (for example, the inter-connect structure 195 as illustrated in FIG. 18). In some embodiments, contacts 150 may be formed using photolithography techniques. For example, a patterned mask may be formed over the second ILD layer 145 and used to etch openings that extend through the second ILD layer 145 to expose a portion of gate electrode 124, as well as etch openings that extend further, through the first ILD layer 140 and the CESL (not shown) below first ILD layer 140 to expose portions of the source/drain regions 110SD of the 2-D material layer 110.

In some embodiments, a conductive liner may be formed in the openings in the first ILD layer 140 and the second ILD layer 145. Subsequently, the openings are filled with a conductive fill material. The liner includes barrier metals used to reduce out-diffusion of conductive materials from the contacts 150 into the surrounding dielectric materials. The conductive liner may include Ti, Ni, Pt, Co, other suitable metals, or their alloys. The conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the second ILD layer 145.

Figure 4:
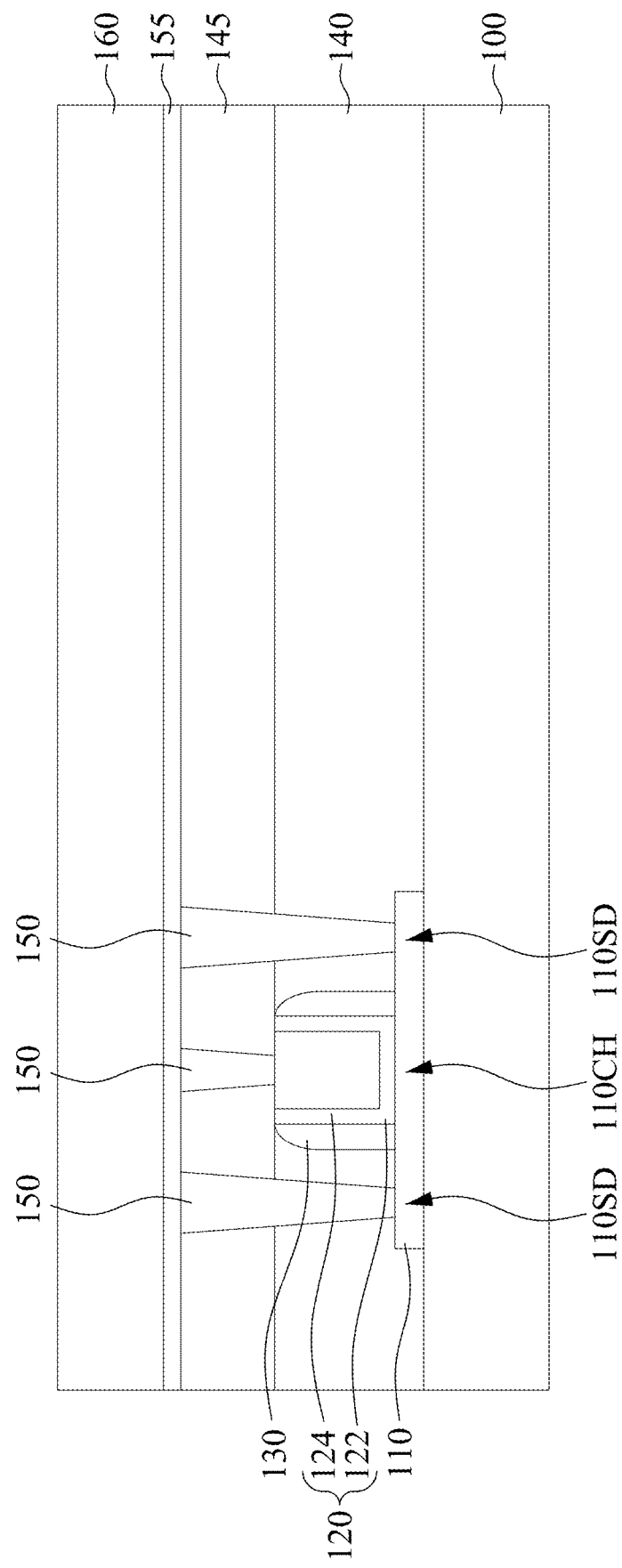

Reference is made to FIG. 4. An etch stop layer 155 is formed over the second ILD layer 145, and an inter-metal dielectric (IMD) layer 160 is formed over the etch stop layer 155. In some embodiments, the etch stop layer 155 includes one or more insulator layers (e.g., SiN, SiC, SiCN, SiCO, CN, combinations thereof, or the like) having an etch rate different than an etch rate of the overlying IMD layer 160. In some embodiments, the IMD layer 160 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The etch stop layer 155 and the IMD layer 160 may be deposited using suitable method, such as CVD, physical vapor deposition (PVD), ALD, PEALD, PECVD, SACVD, FCVD, spin-on, and/or the like, or a combination thereof.

Figure 5:
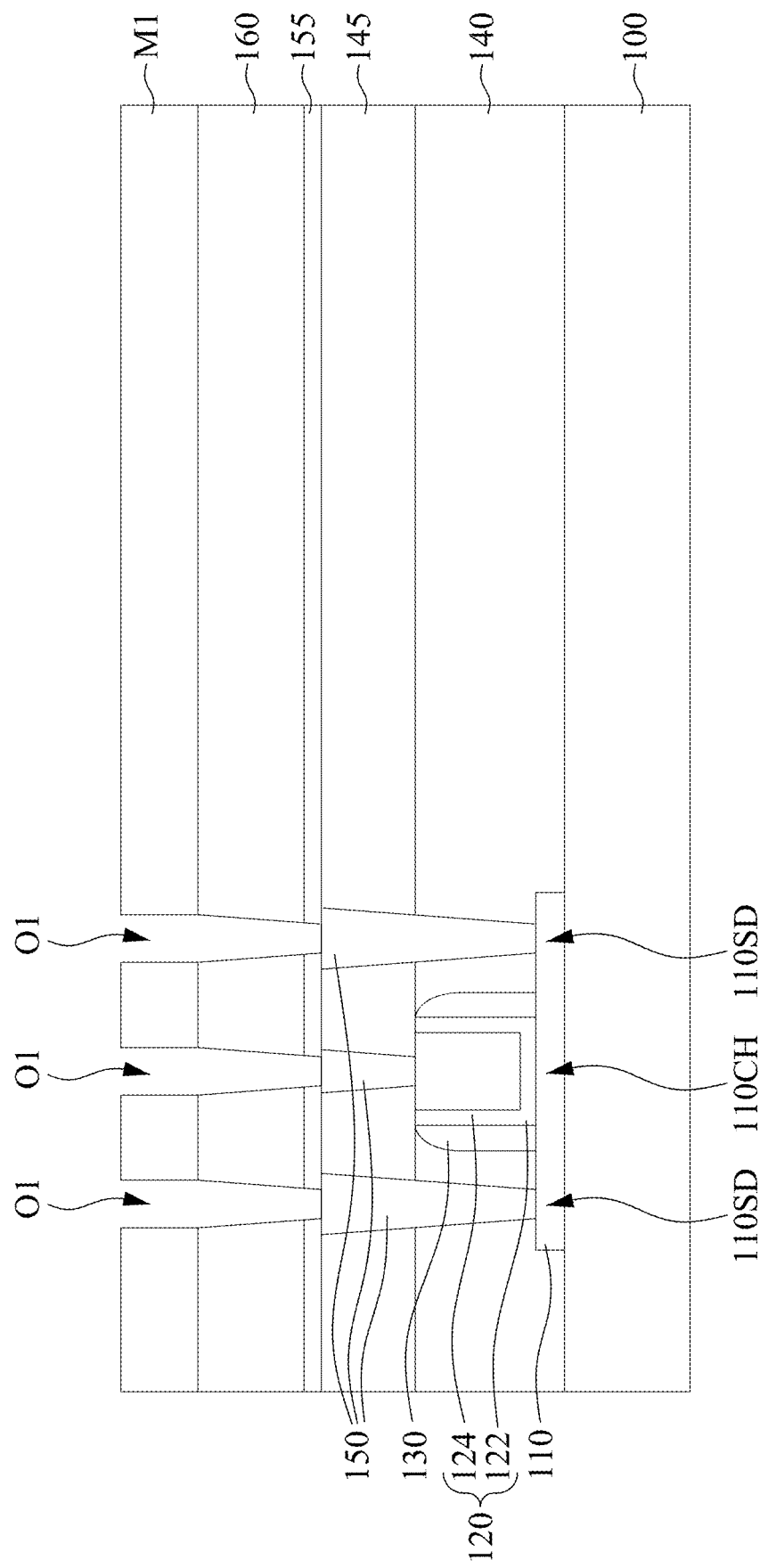

Reference is made to FIG. 5. A patterned mask M1 having openings O1 is formed over the IMD layer 160. Next, an etching process is performed to etch the IMD layer 160 and the etch stop layer 155 through the openings O1 of the patterned mask M1, so as to extend the openings O1 into the IMD layer 160 and the etch stop layer 155 to expose the contacts 150. In some embodiments, the patterned mask M1 may be a photoresist, a hard mask, or suitable materials, and may be patterned using a photolithography technique.

Figure 6A:
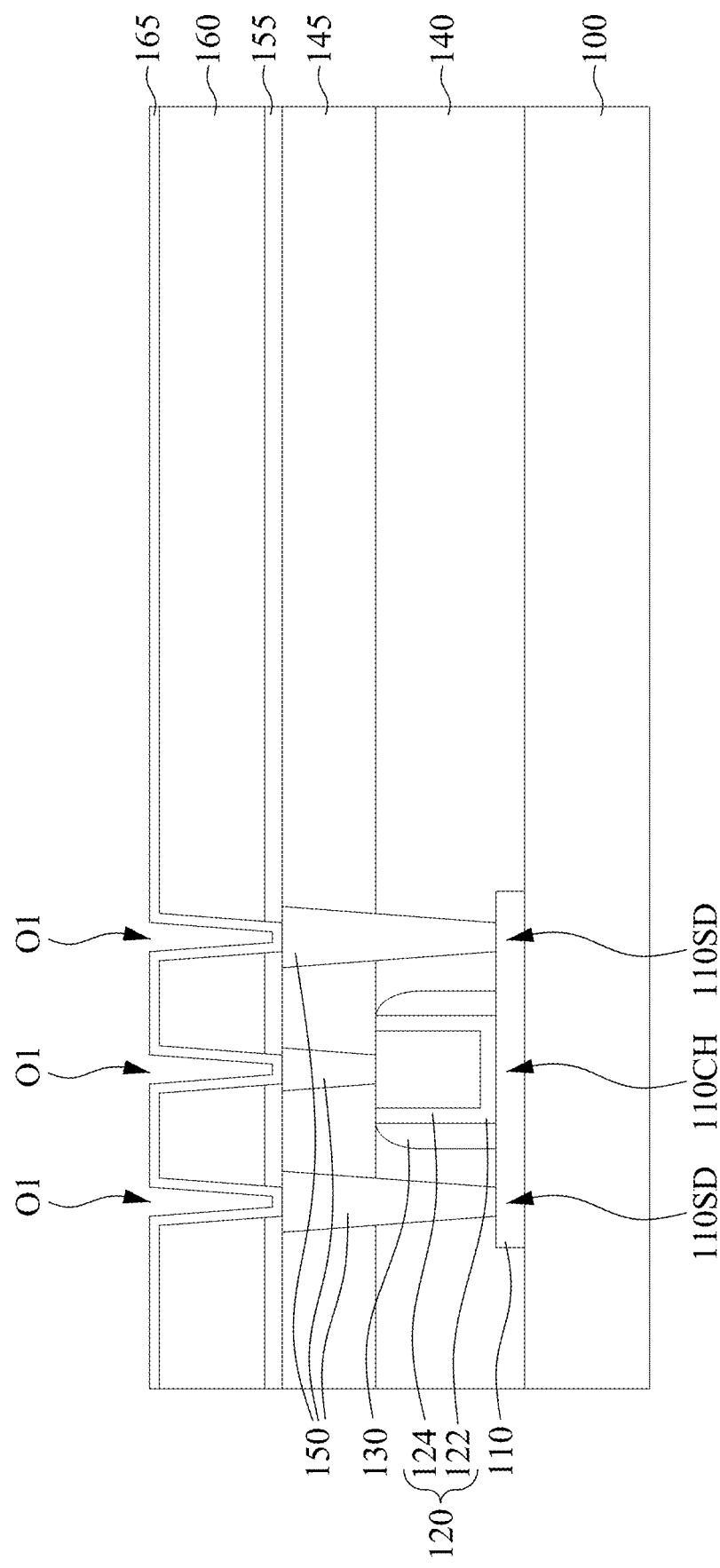

Reference is made to FIG. 6A. The patterned mask M1 is removed. Afterwards, a 2-D material layer 165 is formed lining the openings O1 in the IMD layer 160 and the etch stop layer 155, and lining the top surface of the IMD layer 160. In some embodiments, the formation of the 2-D material layer 165 may include direct growth or mechanical attachment. Possible growth methods for the 2-D material layer 165 may include chemical vapor deposition (CVD), molecular beam epitaxy (MBE) and sulfurization of pre-deposited transition metals.

In some embodiments, the 2-D material layer 165 includes a transition metal dichacogenide (TMD) monolayer material. In some embodiments, a TMD monolayer includes one layer of transition metal atoms sandwiched between two layers of chalcogen atoms. In some embodiment where the 2-D material layer 165 includes TMD monolayers, the TMD monolayers include molybdenum disulfide ($MoS_2$), tungsten disulfide ($WS_2$), tungsten diselenide ($WSe_2$), or the like. For example, $MoS_2$ and $WS_2$ may be formed by micromechanical exfoliation and coupled over the IMD layer 160, or by sulfurization of a pre-deposited molybdenum (Mo) film or tungsten (W) film over the substrate 100. In alternative embodiments, $WSe_2$ may be formed by micromechanical exfoliation and coupled over the IMD layer 160, or by selenization of a pre-deposited tungsten (W) film over the IMD layer 160 using thermally cracked Se molecules.

Figure 6B:
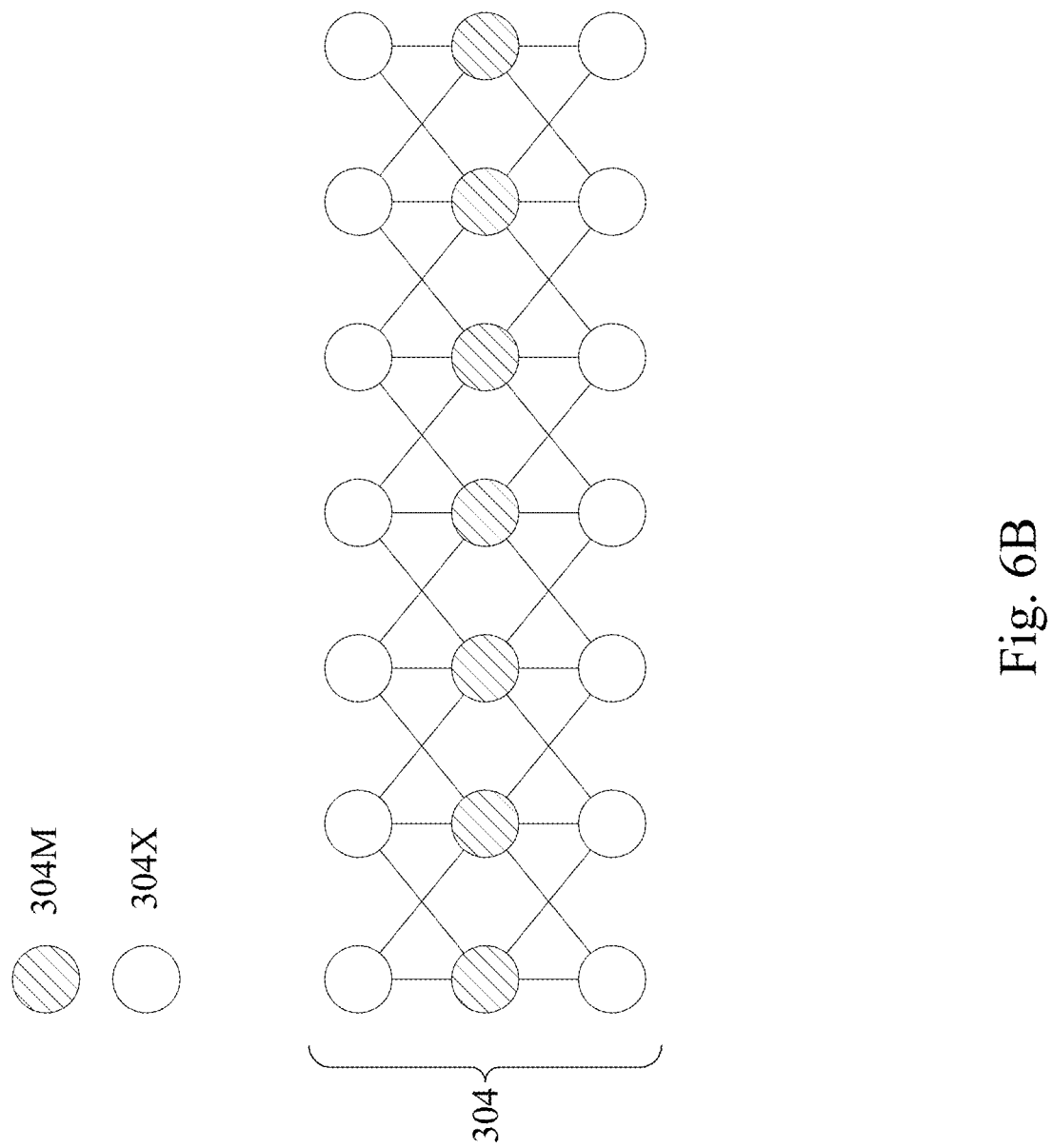

FIG. 6B illustrates a schematic view of a mono-layer 304 of an example TMD in accordance with some example embodiments. In FIG. 6B, the one-molecule thick TMD material layer comprises transition metal atoms 304M and chalcogen atoms 304X. The transition metal atoms 304M may form a layer in a middle region of the one-molecule thick TMD material layer, and the chalcogen atoms 304X may form a first layer over the layer of transition metal atoms 304M, and a second layer underlying the layer of transition metal atoms 304M. The transition metal atoms 304M may be W atoms or Mo atoms, while the chalcogen atoms 304X may be S atoms, Se atoms, or Te atoms. In the example of FIG. 6B, each of the transition metal atoms 304M is bonded (e.g. by covalent bonds) to six chalcogen atoms 304X, and each of the chalcogen atoms 304X is bonded (e.g. by covalent bonds) to three transition metal atoms 304M. Throughout the description, the illustrated cross-bonded layers including one layer of transition metal atoms 304M and two layers of chalcogen atoms 304X in combination are referred to as a mono-layer 304 of TMD.

In some other embodiments where $MoS_2$ is formed by micromechanical exfoliation, the 2-D material layer 165 is formed on another substrate and then transferred to the substrate 100. For example, a 2-D material film is formed on a first substrate by chemical vapor deposition (CVD), sputtering or atomic layer deposition in some embodiments. A polymer film, such as poly(methyl methacrylate) (PMMA), is subsequently formed on the 2-D material film. After forming the polymer film, the sample is heated, such as by placing the sample on a hot plate. Subsequent to heating, a corner of the 2-D material film is peeled off the first substrate, such as by using a tweezers, and the sample is submerged in a solution to facilitate the separation of the 2-D material film from the first substrate. The 2-D material film and polymer film are transferred to the substrate 100. The polymer film is then removed from the 2-D material film using a suitable solvent.

In some embodiments where $MoS_2$ is formed by sulfurizing a pre-deposited molybdenum (Mo) film over the IMD layer 160, a Mo film may be deposited over the IMD layer 160, by suitable process, such as using RF sputtering with a molybdenum target to form the Mo film on the substrate 100. After the Mo film is deposited, the IMD layer 160 as well as the Mo film are moved out of the sputtering chamber and exposed to air. As a result, the Mo film will be oxidized and form Mo oxides. Then, the sample is placed in the center of a hot furnace for sulfurization. During the sulfurization procedure, Ar gas is used as a carrier gas with the S powder placed on the upstream of the gas flow. The S powder is heated in the gas flow stream to its evaporation temperature. During the high-temperature growth procedure, the Mo oxide segregation and the sulfurization reaction will take place simultaneously. If the background sulfur is sufficient, the sulfurization reaction will be the dominant mechanism. Most of the surface Mo oxides will be transformed into $MoS_2$ in a short time. As a result, a uniform planar $MoS_2$ film will be obtained on the substrate after the sulfurization procedure.

In some embodiments, the 2-D material layer 165 may include metal, such as aluminum (Al), silver (Ag), tin (Sn), tungsten (W). In some other embodiments, the 2-D material layer 165 may also include gold (Au) or platinum (Pt). In some embodiments, the 2-D material layer 165 may include graphene.

Figure 7:
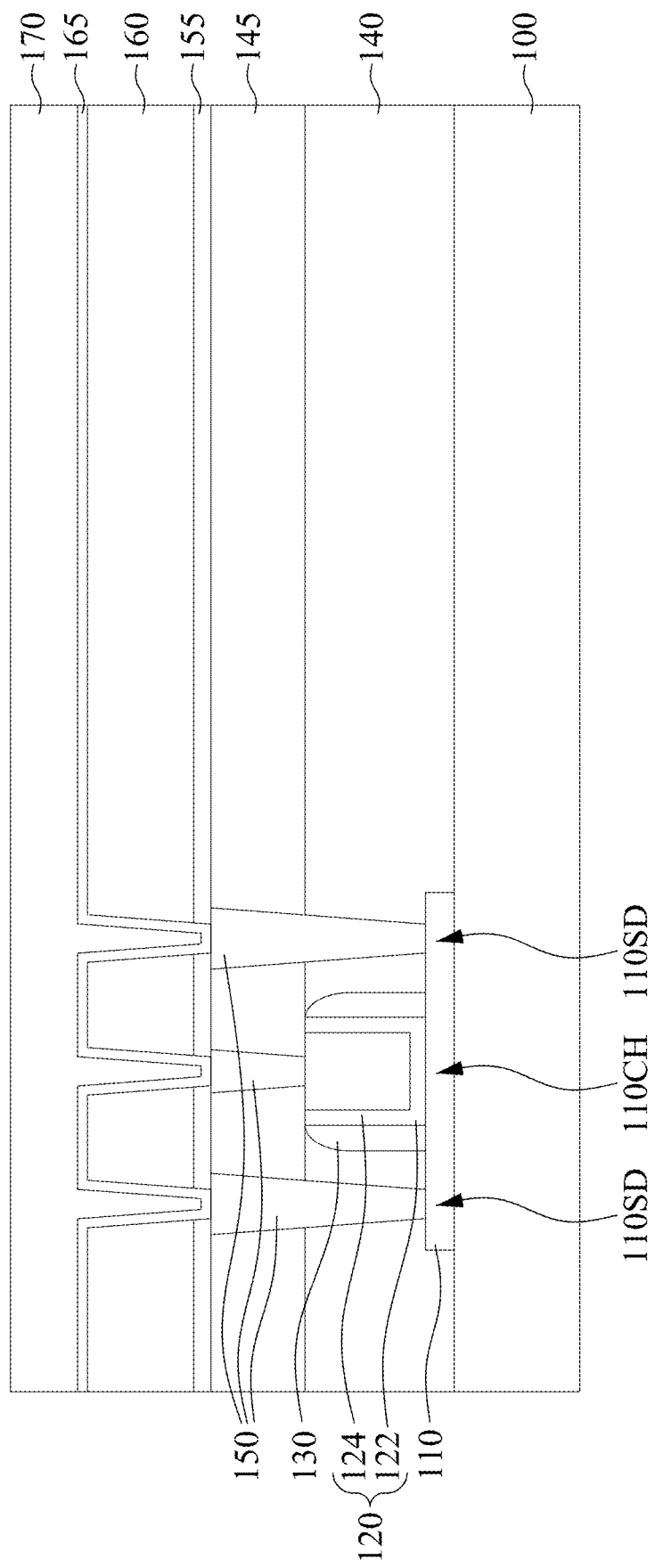

Reference is made to FIG. 7. A metal via layer 170 is formed over the 2-D material layer 165 and overfilling the openings O1 (see FIG. 6A). In some embodiments, the metal via layer 170 may be single-element metal, such as gold (Au), silver (Ag), platinum (Pt), tungsten (W), copper (Cu), or other suitable metals. In some embodiments, the metal via layer 170 may be deposited using molecular beam epitaxy (MBE), e-gun evaporation, sputtering, or other suitable deposition methods. In some embodiments, the metal via layer 170 may include single-crystal structure instead of poly-crystal structure. This is because the metal via layer 170 is formed on a 2-D material surface (e.g., the 2-D material layer 165), and details will be discussed below.

Figure 8B:
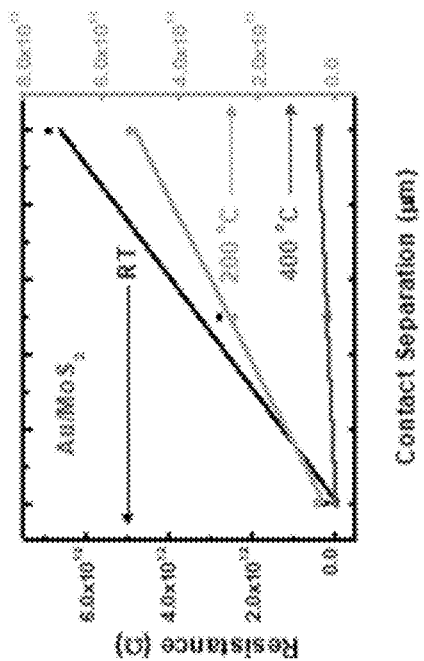
FIG. 8B shows resistance values of metal film on a 2-D material surface with different separations in accordance with some embodiments.
Figure 8A:
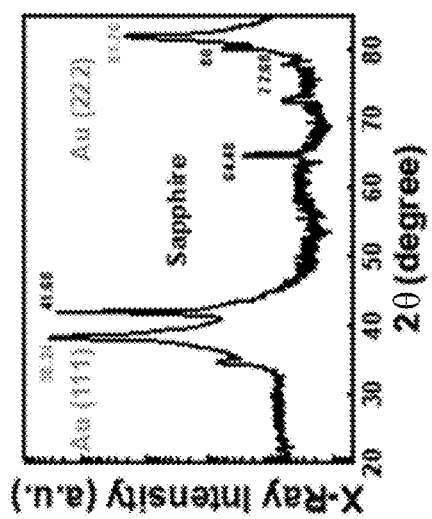
FIG. 8A is an X-ray diffraction (XRD) curve in accordance with some embodiments.

Reference is made to FIG. 8A. To investigate this possibility, a metal film (e.g., the metal via layer 170) is deposited onto a 2-D material surface (e.g., 2-D material layer 165), such as an Au film is deposited on a $MoS_2$ film, by using thermal evaporation at a temperature in a range from about 25° C. to about 500° C., such as about 400° C. The background pressure of the system is kept in a range from about $2.5 \times 10^{-6}$ torr to about $3.5 \times 10^{-6}$ torr (e.g., $3 \times 10^{-6}$ torr), and the deposition rate is in a range from about 0.1 Å/sec to about 1.5 Å/sec (e.g., 0.4 Å/sec). The temperature ramp rate is in a range from about 15° C./min to about 20° C./min (e.g., 20° C./min). Before metal deposition, the sample will stay at the deposition temperature for about 5 min. Besides the thermal evaporation, similar growth techniques such as molecular beam epitaxy (MBE), e-gun evaporation and sputtering can be adopted for the metal deposition. As shown in the X-ray diffraction (XRD) curve of FIG. 8A, except for the peaks corresponding to the 2-D material surface, strong Au (111) and Au (222) peaks are also observed in FIG. 8A. The results have shown that the existence of single-crystal Au on a 2-D material surface (e.g., $MoS_2$ or sapphire). Furthermore, in a cross-sectional HRTEM image, well-stacked single-crystal Au is observed on a 2-D material surface. The results have demonstrated that except for 2-D materials, other crystals can also be grown on a 2-D material surface through the van der Waals epitaxy.

Moreover, the influence of temperature to Au film growth on a 2-D material surface has been studied. In some embodiments, Au films grown on $MoS_2$ at 25° C. (room temperature; RT), 200° C. and 400° C. are prepared. Based on the experiment results, poly-crystalline Au film is observed for the sample grown at 25° C. (room temperature; RT). With increasing deposition temperatures, well-aligned single-crystal Au film is observed for the deposition temperature greater than about 200° C. and lower than about 400° C. This indicates that suitable deposition temperature (e.g., greater than about 200° C. and lower than about 400° C.) of single-crystal gold on a 2-D material surface may be possible for practical device application. Accordingly, in some embodiments where the 2-D material layer 165 is made of $MoS_2$, and the metal via layer 170 is made of Au, the deposition temperature of the metal via layer 170 is in a range from about 200° C. to about 400° C.

Reference is made to FIG. 8B. Furthermore, the single-crystal Au can also reduce contact resistance. For example, the resistance values of an Au film on a 2-D material surface (e.g., $MoS_2$) with different separations are shown in FIG. 8B. Different deposition temperatures 25° C. (room temperature; RT), 200° C., and 400° C. are adopted for Au deposition. As shown in FIG. 8B, decreasing resistance values are observed with increasing deposition temperatures, this may be resulted from the improved crystalline quality with increasing deposition temperatures. By using the transfer line model, the contact resistance value extracted from fitting lines of the three samples would decrease from about $1.68 \times 10^8$, to about $1.02 \times 10^7$, and to about $1.68 \times 10^5$ $\Omega \cdot cm^2$ for the three samples with increasing deposition temperatures for the Au films. The results have demonstrated that by single-crystal Au as the contact metal with a 2-D material surface, significant contact resistance reduction at the metal/2-D material interface can be observed.

Figure 9B:
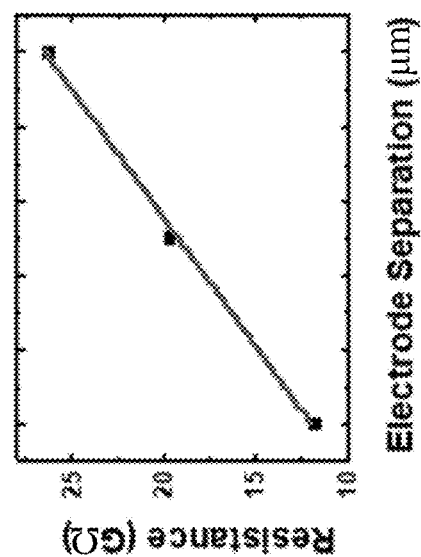
FIG. 9B shows resistance values of metal film on a 2-D material surface with different separations in accordance with some embodiments.
Figure 9A:
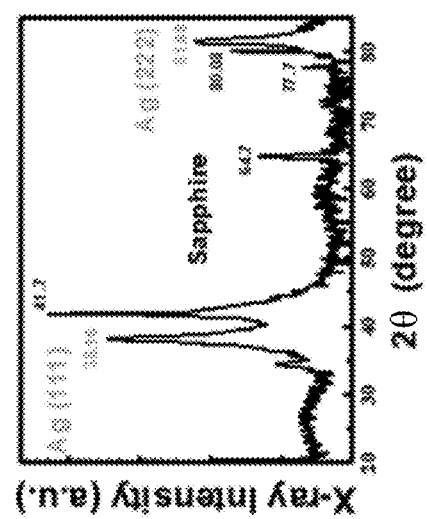
FIG. 9A is an X-ray diffraction (XRD) curve in accordance with some embodiments.

Reference is made to FIG. 9A. To further reduce the contact resistance, metals with similar crystal structure as Au and having smaller work function may be considered. In some embodiments where the metal via layer 170 is made of silver (Ag), and the 2-D material layer is made of $MoS_2$, the XRD curve of silver (Ag) deposited on a 2-D material surface (e.g., $MoS_2$) at room temperature is shown in FIG. 9A. Similar to the case of Au (see FIG. 8A), Ag (111) and Ag (222) peaks are also observed. The results have demonstrated that through van der Waals epitaxy, single-crystal Ag can also be grown on a 2-D material surface.

Reference is made to FIG. 9B. The resistance values of Ag contact with different separations are shown. The deposition temperature for Ag is about 25° C. (room temperature; RT). By using the transfer line model, the contact resistance value extracted from line is about $1.01 \times 10^4$ $\Omega \cdot cm^2$ for Ag contact prepared at room temperature, which is one order of magnitude lower than the Au electrode. Since the work function of Ag is lower than Au, the contact resistance between Ag film and a 2-D material surface is lower than the contact resistance between Au film and the 2-D material surface.

Figure 10:
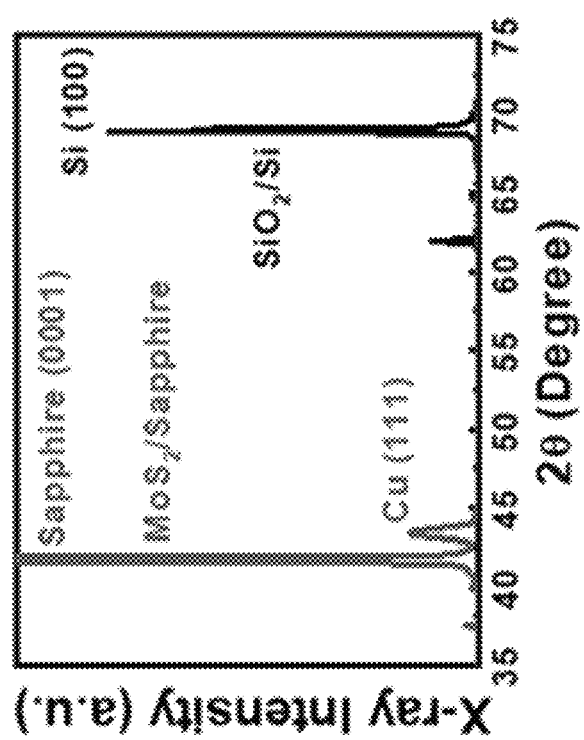
FIG. 10 is an X-ray diffraction (XRD) curve in accordance with some embodiments.

Reference is made to FIG. 10. Because copper (Cu) is commonly used in interconnection, the formation of copper on a 2-D material surface is investigated. By using an e-beam deposition system, Cu films (about 20 nm) are deposited respectively on a $SiO_2$/Si substrate, sapphire substrate, and a $MoS_2$/sapphire substrate at about 25° C. (room temperature; RT). The deposition rate is kept at about 0.1 Å/sec to about 1.5 Å/sec (e.g., 0.5 Å/sec). The sheet resistances of three samples are 13.14Ω/sq, 9.71Ω/sq, and 4.46Ω/sq, respectively. A much lower sheet resistance is observed for the Cu film grown on the $MoS_2$ surface. The results suggest that the van der Waals epitaxy may also help the lateral growth of continuous Cu films on a $MoS_2$ surface with better crystalline quality. FIG. 10 shows the X-ray diffraction (XRD) curves of the samples with Cu films (about 20 nm) grown on $SiO_2$/Si and $MoS_2$/sapphire substrates. As shown in FIG. 10, with only Si (100) peak observed for the sample grown on the $SiO_2$/Si substrate, an additional Cu (111) peak is observed for the sample grown on $MoS_2$ surface. This indicates that a single-crystal Cu film is obtained on a 2-D material surface. Besides the lateral growth of Cu films, the van der Waals epitaxy may also help to improve the crystallinity of the metal films, which is consistent with the observation of Au films grown on $MoS_2$ surface as discussed in FIG. 8A. The cross-sectional HRTEM image of the sample with Cu film grown on the $MoS_2$ surface also shows that single-crystal Cu grains are observed on a $MoS_2$ surface, which is consistent with the observation from X-ray diffraction curves that improved crystallinity is obtained on the $MoS_2$ surface with the assistance of van der Waals epitaxy on a 2-D material surface.

Although the low sheet resistance and improved crystallinity of Cu films grown on a $MoS_2$ surface may suggest that 2-D material layer may act as the thin barrier layer for interconnects and the van der Waals epitaxy on a 2-D material surface will help to reduce the resistivity of the metal wires, there are still issues to be solved. The first one is that sulfur is a chemically active element. The other issue is that at higher deposition temperatures, the cooper atoms may diffuse into the $MoS_2$ layer and induce a failure issue for the barrier layer of the interconnects.

Figure 11:
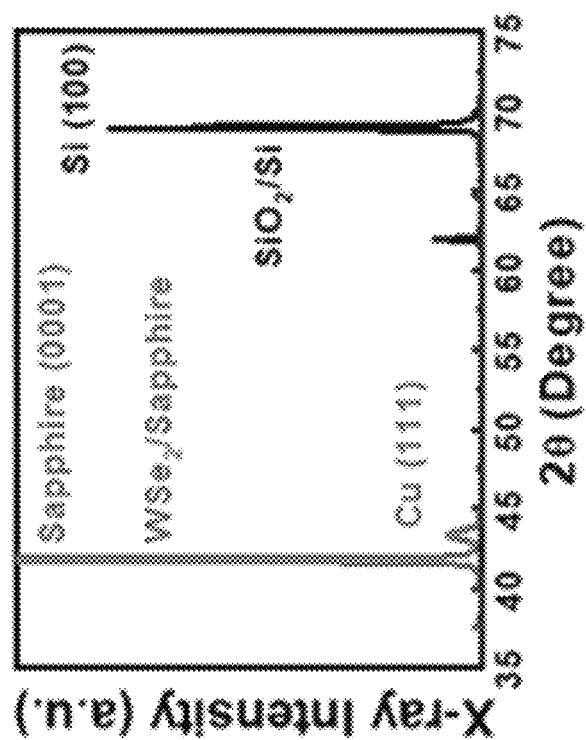
FIG. 11 is an X-ray diffraction (XRD) curve in accordance with some embodiments.

Reference is made to FIG. 11. To take the advantage of van der Waals epitaxy on a 2-D material surface and to avoid the diffusion issue occurred on the Cu film grown on a $MoS_2$ layer, a Cu film (about 20 nm) is deposited on a $WSe_2$ surface at about 25° C. (room temperature; RT). FIG. 11 shows the X-ray diffraction (XRD) curve of the sample. For comparison the diffraction curve of the sample grown on $SiO_2$ is also shown in FIG. 11. As shown in FIG. 11, a clear Cu (111) peak is observed in the figure, which is similar to the phenomenon observed on the $MoS_2$ surface. Besides the observation of Cu (111) peak on the diffraction curve, an even lower sheet resistance 3.08Ω/sq is observed for the Cu film grown on a $WSe_2$ surface. The results suggest that the same van der Waals epitaxy of cooper will also take place at $WSe_2$ surfaces. Films' continuity and crystallinity are both improved due to the unique van der Waals epitaxy growth on a 2-D material surface. To investigate the temperature endurance of the 2-D material layer, another sample with 20 nm Cu grown at 200° C. on a $WSe_2$ surface is prepared. The cross-sectional HRTEM image of Cu grown on a $WSe_2$ surface shows that the $WSe_2$ film is well attached to the sapphire surface even at higher deposition temperature. The results have demonstrated that the van der Waals epitaxy will take place on different 2-D material surfaces. In this case, a 2-D material layer with better temperature endurance may it possible to act as a diffusion barrier layer for interconnect.

As discussed in FIGS. 7, 8A, 8B, 9A, 9B, 10, and 11, the results reveal that through van der Waals epitaxy, different crystals other than 2-D materials can also be grown on a 2-D material surface. The less dependence of the metals on the 2-D material layer makes this unique growth technique a promising approach for hetero-structure establishment with large lattice constant mismatch. Besides the application of single-crystal metal films as the contact electrodes, since van der Waals epitaxy would take place easily on 2-D material surfaces, it is also possible to use the 2-D material as the intermediate layer with different semiconductors. For example, GaN grown on either graphene or hBN surfaces for micro-LED fabrications or other semiconductor materials on Si.

Figure 12C:
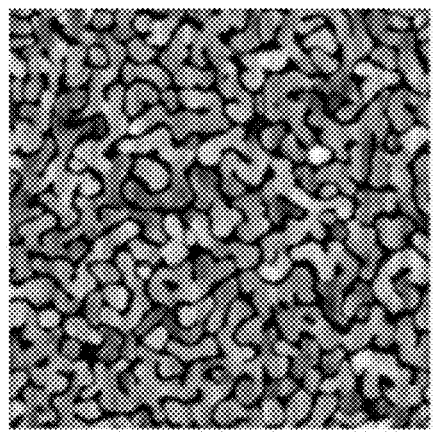
FIGS. 12A, 12B, and 12C are crystalline structures in accordance with some embodiments.
Figure 12B:
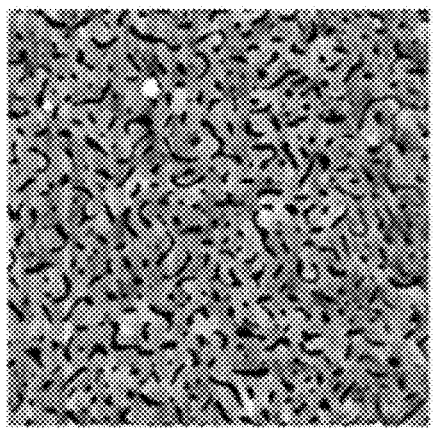
Figure 12A:
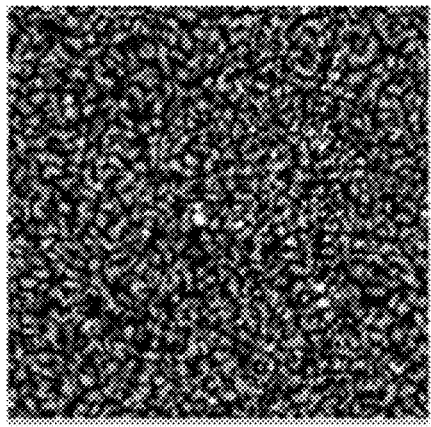

Reference is made to FIGS. 12A, 12B, and 12C. In some embodiments, the superior crystalline quality (e.g., single-crystal) of the thin metal film grown on a 2-D material surface may also help to reduce the resistance of interconnect purpose. To investigate this possibility, a thin metal film (e.g., the metal via layer 170) is deposited on a 2-D material substrate (e.g., the 2-D material layer 165) at about 25° C. (room temperature; RT), about 100° C., and about 200° C., respectively. For example, the metal film may be Au with about 10 nm thickness, and the 2-D material substrate may be a $MoS_2$/sapphire substrate. FIGS. 12A, 12B, and 12C illustrate top views of metal films growth at about 25° C. (room temperature; RT), about 100° C., and about 200° C., respectively. As shown in FIGS. 12A, 12B, and 12C, increasing grain sizes of the gold clusters are observed with increasing deposition temperatures. The results have demonstrated that adatom migration and coalescence would occur for the metal atoms as the deposition temperature increasing from about 25° C. to about 200° C.

As shown in FIGS. 12A, 12B, and 12C, the metal films growth at about 100° C. (FIG. 12B) and about 200° C. (FIG. 12C) have better crystalline quality than the metal film growth at about 25° C. As mentioned above, the better crystalline quality is supposed to reduce contact resistance at the interface between the metal film and the 2-D material layer. Furthermore, the crystalline of the metal film growth at 200° C. tend to form more separated clusters and larger grain size than the crystalline of the metal film growth at 100° C.

To further investigate the crystalline quality of the metal films, the cross-sectional HRTEM images of the three samples growth at 25° C. (room temperature; RT), 100° C., and 200° C. are detected. Generally, clear grain boundaries are observed for the two samples grown at 25° C. and 100° C. On the other hand, single-crystal structure is observed for the sample grown at 200° C. The results show that with increasing deposition temperature, enhanced crystalline quality will be observed for the thin metal films. However, as discussed above, separated grain clusters may also be obtained with increasing deposition temperatures. The results show that for the application of interconnects, a balance has to be made between improved crystalline quality and film completeness. As an example where the metal includes gold, the sheet resistance of the three samples are $9.37 \times 10^0 \Omega/sq$ (25° C.), $2.45 \times 10^0 \Omega/sq$ (100° C.; which is the lowest value for gold film~10 nm) and $5.71 \times 10^3 \Omega/sq$ (200° C.), respectively. The results properly reflect that the improved crystalline quality of a metal film on a 2-D material surface can reduce resistance. However, the metal clusters formed at higher temperature (e.g., 200° C.) will lead to a poor laterally electrical connection (e.g., higher sheet resistance), because the current is confined along the lateral direction. Accordingly, with improved crystalline quality of a metal film on a 2-D material surface at higher deposition temperature (e.g., 100° C.) and less clusters formation, low sheet resistance can be obtained for the thin metal film.

Furthermore, another sample with 5 nm Au grown on a $MoS_2$/sapphire substrate at 100° C. is also prepared. The sheet resistance of the sample is $2.0 \times 10^2 \Omega/sq$. The results also show that plane and highly conductive gold films can be obtained on a 2-D material surface. To demonstrate this point, a cross-sectional HRTEM image of single-crystalline gold can also observed on a graphene/sapphire substrate at 400° C. by using a thermal evaporation system. The unique characteristic of van der Waals epitaxy happening on a 2-D material surface is beneficial for crystal growth on the 2-D material surface. Therefore, the metal films formed at suitable deposition temperature on a 2-D material surface can be quite useful for the application of backend interconnects.

As discussed in FIGS. 7, 8A, 8B, 9A, 9B, 10, 11, 12A, 12B, and 12C, it can be summarized that a metal film can be grown on a 2-D material surface with superior crystalline quality. For example, a single-crystal structure of metal film can be obtained on a 2-D material surface. In some embodiments of FIG. 7, the metal via layer 170 with single-crystal structure can be formed on the 2-D material layer 165 using suitable deposition process, such as thermal evaporator, e-beam deposition, sputtering, or other suitable deposition processes. In some embodiments, the deposition rate of the metal via layer 170 may be in a range from about 0.1 Å/sec to about 1.5 Å/sec.

As discussed above, the crystalline quality of the metal via layer 170 may be improved as the deposition temperature increases from room temperature (e.g., 25° C.) to a higher temperature (e.g., 100° C., 200° C., or 400° C.). On the other hand, as discussed in FIGS. 12A to 12C, metal grain clusters may be obtained when the metal film is grown at a higher temperature (e.g., about 200° C.), the laterally separated clusters may lead to poor laterally electrical connection (e.g., higher sheet resistance), because the current is confined along the lateral direction. However, as the current is confined along the lateral direction, this may result in that the current can only travel along the vertical direction, which in turn will improve vertically electrical connection.

Figure 13:

It is noted that portions of the metal via layer 170 will as serve as metal vias (e.g., metal vias 172 in FIG. 13). Here, the term "metal via" may be a conductive structure having longest dimension extending vertically, in which a metal via is used to conduct current vertically and is used to electrically connect two conductive features located at vertically adjacent levels. Accordingly, although the separated clusters obtained at higher deposition temperature may affect lateral electrical connection, it may be adopted to the metal via layer 170, because the metal via layer 170 will be used as a vertical connection purpose. That is, in some embodiments, the deposition temperature of the metal via layer 170 over the 2-D material layer 165 may be in a range from about 25° C. to about 400° C. In some embodiments, during the deposition process of the metal via layer 170, the metal via layer 170 may include varied deposition temperature. For example, during deposition process of the metal via layer 170, the temperature may increase from a low temperature to a high temperature, and then decreases from the high temperature to the low temperature. In some embodiments, the low temperature may be about 25° C. to about 27° C. (room temperature). The high temperature may be in a range from about 50° C. to about 200° C. In some embodiments, the high temperature may be in a range from about 50° C. to about 400° C.

In some other embodiments, the during the deposition process of the metal via layer 170, the deposition temperature of the metal via layer 170 may be at about 25° C. to about 27° C. After the deposition process, an annealing process may be performed to recrystallize the metal via layer 170 to obtain a better crystalline quality. In some embodiments, a temperature of the annealing process may be in a range from about 50° C. to about 200° C., or may be range from about 50° C. to about 400° C. Here, the deposition process may be the duration between the starting providing the precursor of the metal via layer 170 into the deposition chamber and the stopping providing the precursor of the metal via layer 170.

Reference is made to FIG. 13. A chemical mechanism polishing (CMP) process is performed to remove excess materials of the 2-D material layer 165 and the metal via layer 170 (see FIG. 7). After the CMP process, the top surface of the IMD layer 160 is exposed. The remaining portions of the metal via layer 170 form individual metal vias 172, with 2-D material layer 165 cupping sidewalls and bottom surface of each metal via 172. In some embodiments where the 2-D material layer 165 is made of a transition metal dichacogenide (TMD) material, such as molybdenum disulfide ($MoS_2$), tungsten disulfide ($WS_2$), tungsten diselenide ($WSe_2$), the 2-D material layer 165 can act as a diffusion barrier layer. On the other hand, if the 2-D material layer 165 is made of a conductive material, such as graphene, aluminum (Al), silver (Ag), germanium (Ge), tin (Sn), tungsten (W), gold (Au), platinum (Pt), or other suitable conductive materials, the 2-D material layer 165 and the metal via 172 can collectively act as a via structure in the IMD layer 160.

Figure 14:
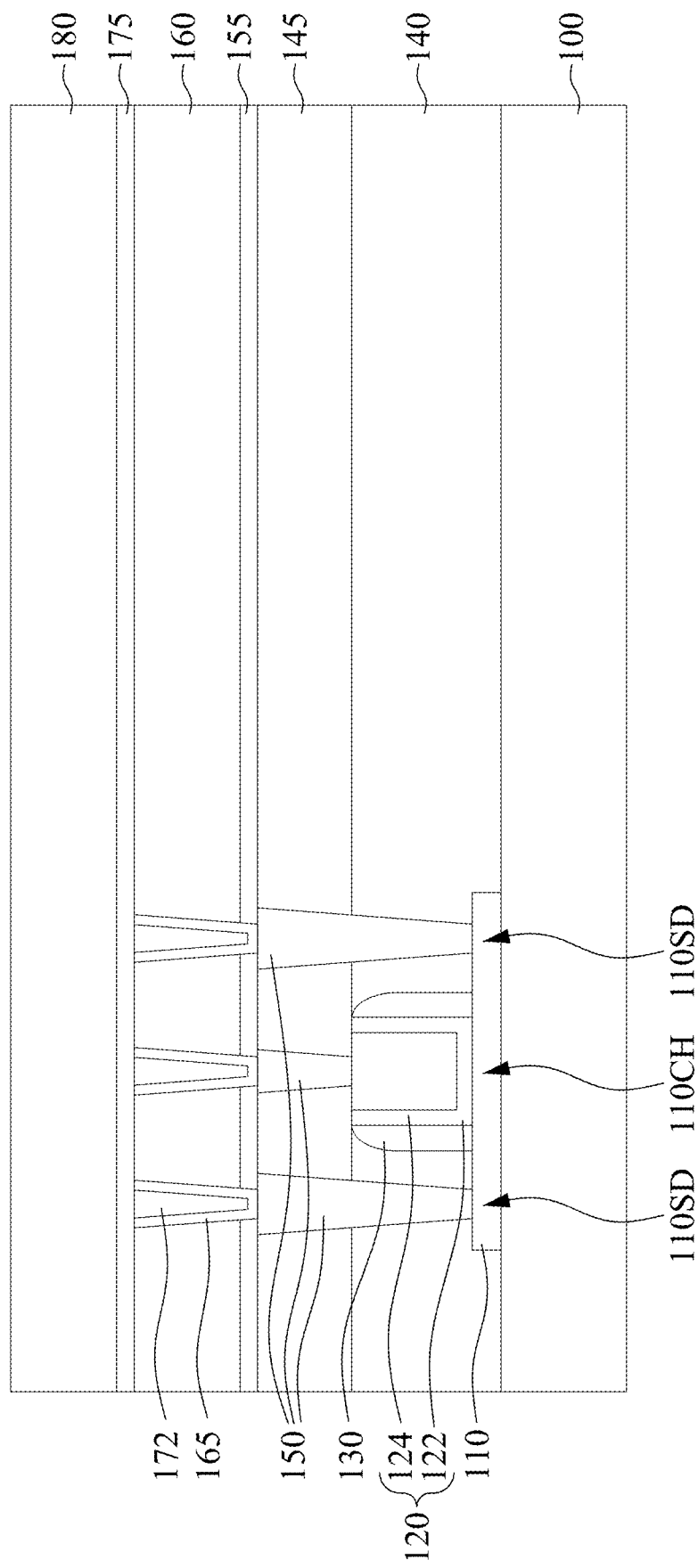

Reference is made to FIG. 14. An etch stop layer 175 is formed over the IMD layer 160, and an inter-metal dielectric (IMD) layer 180 is formed over the etch stop layer 175. In some embodiments, the etch stop layer 175 includes one or more insulator layers (e.g., SiN, SiC, SiCN, SiCO, CN, combinations thereof, or the like) having an etch rate different than an etch rate of the overlying IMD layer 180. In some embodiments, the IMD layer 180 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The etch stop layer 175 and the IMD layer 180 may be deposited using suitable method, such as CVD, physical vapor deposition (PVD), ALD, PEALD, PECVD, SACVD, FCVD, spin-on, and/or the like, or a combination thereof.

Figure 15:
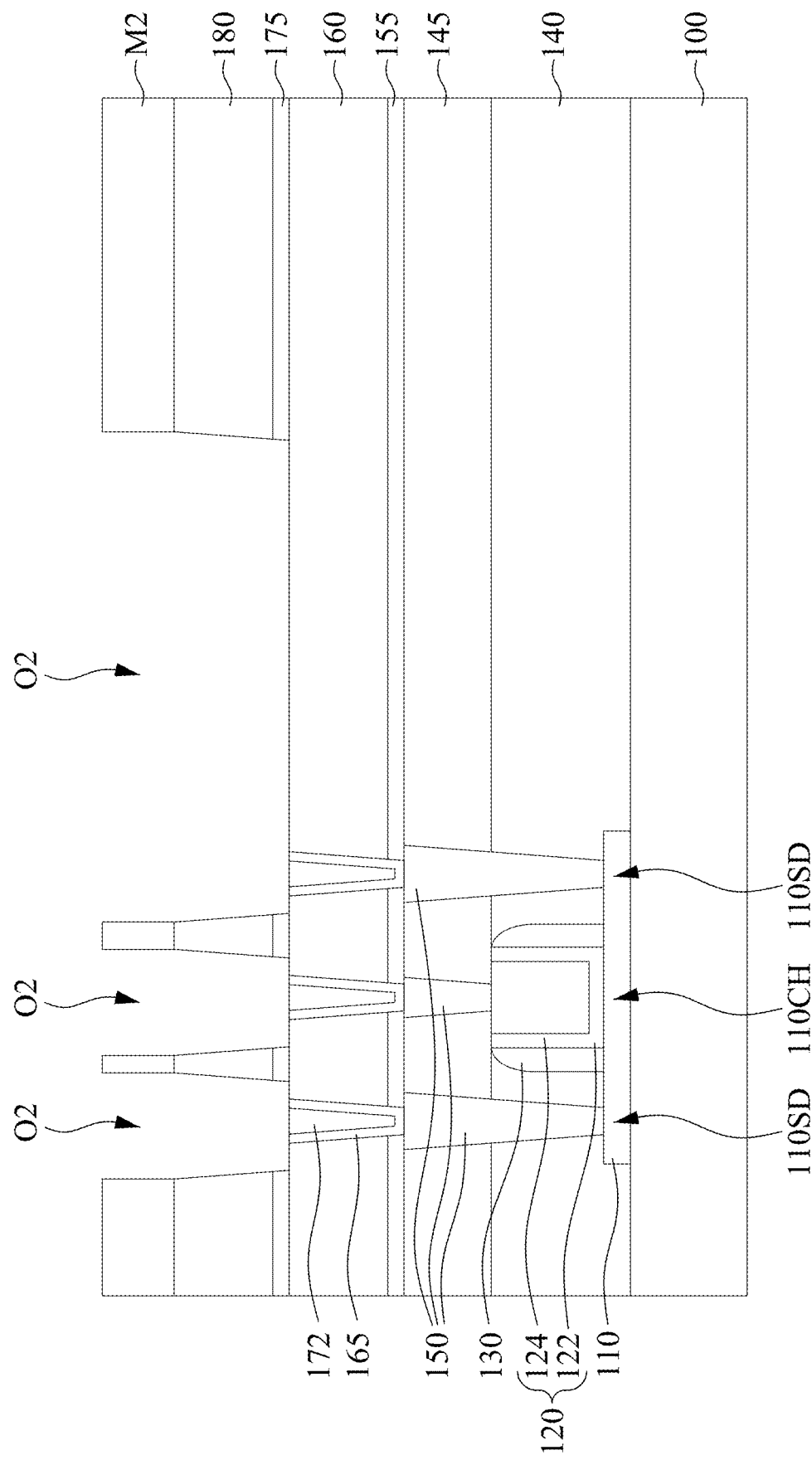

Reference is made to FIG. 15. A patterned mask M2 having openings O2 is formed over the IMD layer 180. Next, an etching process is performed to etch the IMD layer 180 and the etch stop layer 175 through the openings O2 of the patterned mask M2, so as to extend the openings O2 into the IMD layer 180 and the etch stop layer 175 to expose the metal vias 172, the 2-D material layer 165, and the IMD layer 160. In some embodiments, the patterned mask M2 may be a photoresist, a hard mask, or suitable materials, and may be patterned using a photolithography technique.

Figure 16:
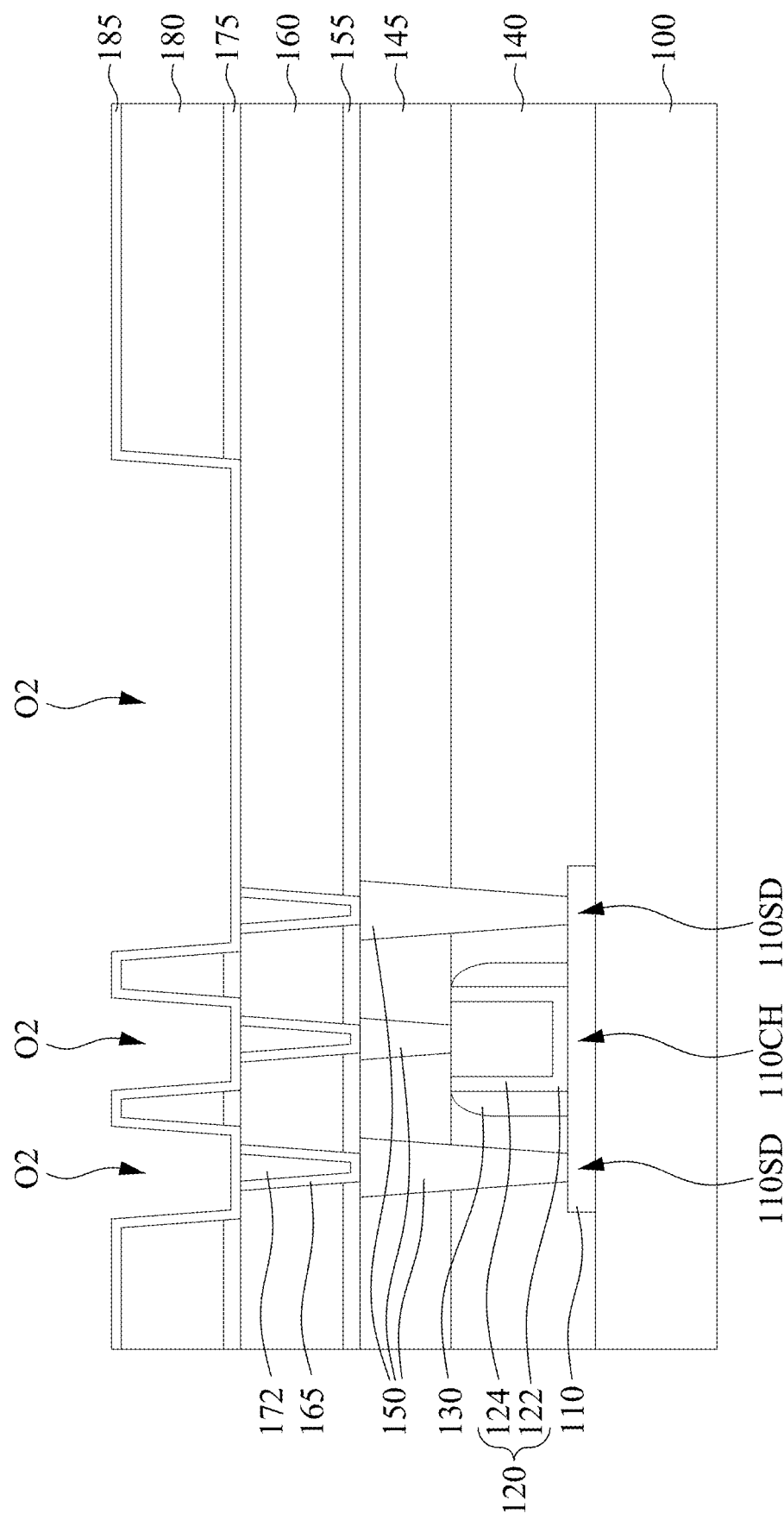

Reference is made to FIG. 16. The patterned mask M2 is removed. Afterwards, a 2-D material layer 185 is formed lining the openings O2 in the IMD layer 180 and the etch stop layer 175, and lining the top surface of the IMD layer 180. In some embodiments, the 2-D material layer 185 is in contact with the metal vias 172 and top ends of the 2-D material layer 165. In some embodiments, the materials and the formation method of the 2-D material layer 185 may be similar to those of the 2-D material layer 185 as described in FIG. 6A, and thus relevant details will not be repeated for simplicity.

Figure 17:
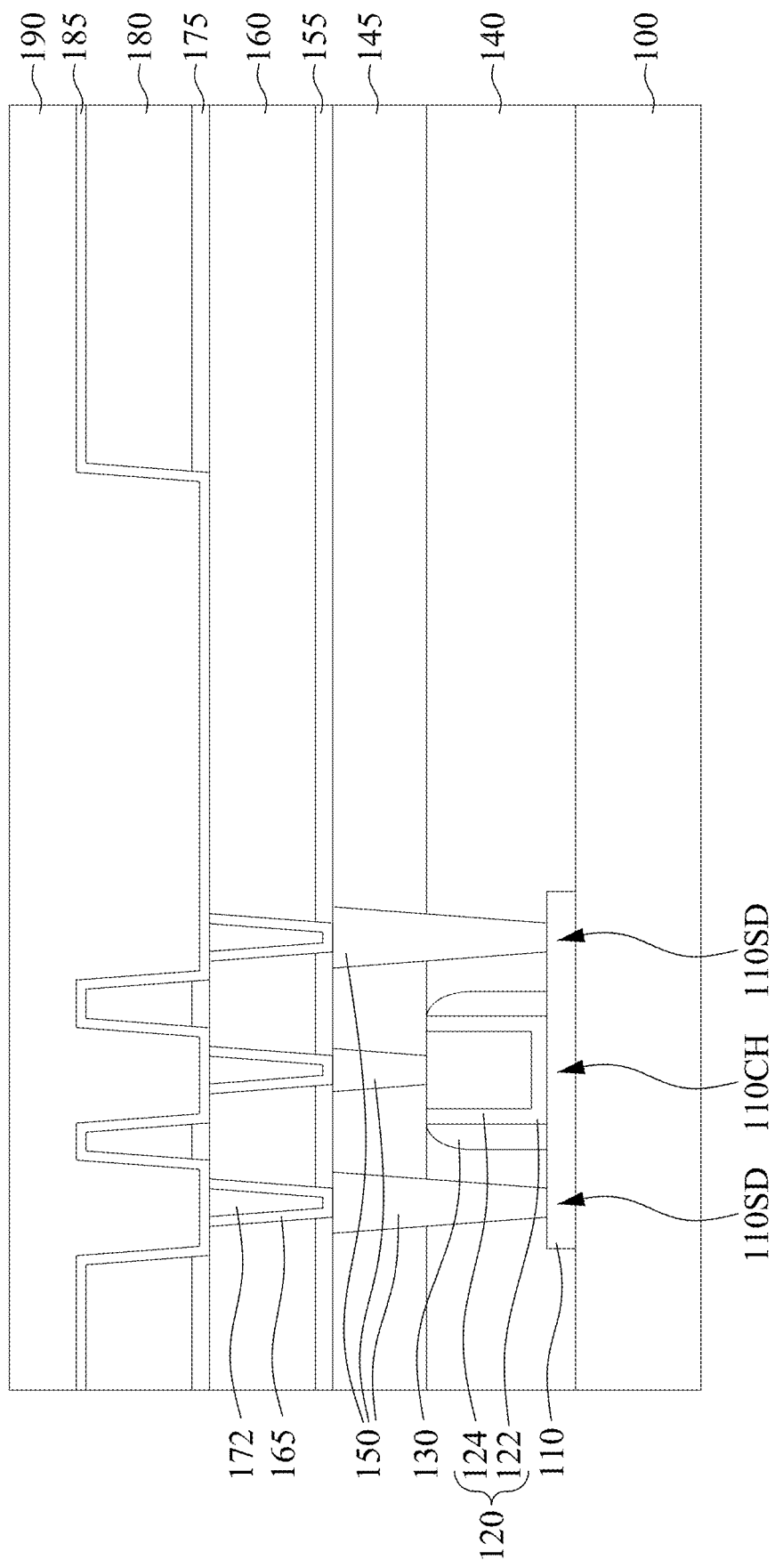

Reference is made to FIG. 17. A metal line layer 190 is formed over the 2-D material layer 185. In some embodiments, the metal line layer 190 may be single-element metal, such as gold (Au), silver (Ag), platinum (Pt), tungsten (W), copper (Cu), or other suitable metals. In some embodiments, the metal line layer 190 may be deposited using thermal evaporation, molecular beam epitaxy (MBE), e-gun evaporation, sputtering, or other suitable deposition methods. In some embodiments, the metal line layer 190 may include single-crystal structure instead of poly-crystal structure. This is because the metal line layer 190 is formed on a 2-D material surface (e.g., the 2-D material layer 185). In some embodiments, the formation method and structural details of the metal line layer 190 may be similar to those of the metal via layer 170 as discussed in FIGS. 7, 8A, 8B, 9A, 9B, 10, 11, 12A, 12B, and 12C, and thus relevant details will not be repeated for simplicity.

The difference between the metal line layer 190 and the metal via layer 170 of FIG. 7 is that, portions of the metal line layer 190 will as serve as metal lines (e.g., metal lines 192 in FIG. 18). Here, the term "metal line" may be a conductive structure having longest dimension laterally, in which the metal lines are used to conduct current laterally and are used to distribute electrical signals and power within one level. As mentioned above, although the increasing deposition temperature of a metal film over a 2-D material surface will improve the crystalline quality, separated grain clusters may also be obtained with increasing deposition temperature (e.g., at about 200° C. as shown in FIG. 12C), in which the separated grain clusters would adversely affect laterally electrical connection. Accordingly, as the metal line layer 190 will be used as a lateral connection purpose, the deposition temperature of the metal line layer 190 needs to be controlled properly.

In some embodiments, the deposition temperature of the metal line layer 190 over the 2-D material layer 185 may be in a range from about 25° C. to about 400° C., while the deposition temperature of the metal line layer 190 over the 2-D material layer 185 may be equal to or lower than the deposition temperature of the metal via layer 170 over the 2-D material layer 165. For example, when the metal via layer 170 and the metal line layer 190 are made of gold (Au), the deposition temperatures of the metal via layer 170 and the metal line layer 190 may be both in a range from about 90° C. to about 110° C., such as 100° C. Alternatively, the deposition temperatures of the metal via layer 170 may be in a range from about 190° C. to about 210° C., such as 200° C., while the deposition temperatures of the metal line layer 190 may be in a range from about 90° C. to about 110° C., such as 100° C.

In some embodiments, during the deposition process of the metal line layer 190, the metal line layer 190 may include varied deposition temperature. For example, during deposition process of the metal line layer 190, the temperature may increase from a low temperature to a high temperature, and then decreases from the high temperature to the low temperature. In some embodiments, the low temperature may be about 25° C. to about 27° C. (room temperature). The high temperature may be in a range from about 50° C. to about 200° C. In some embodiments, the high temperature may be in a range from about 50° C. to about 400° C. In some embodiments where the metal via layer 170 and the metal line layer 190 are formed using the method described herein, during deposition process of the metal via layer 170, the temperature may increase from a first low temperature to a first high temperature, and then decreases from the first high temperature to the first low temperature. On the other hand, during the deposition process of the metal line layer 190, the temperature may increase from a second low temperature to a second high temperature, and then decreases from the second high temperature to the second low temperature. In some embodiments, the first low temperature may be substantially equal to the second low temperature, such as about 25° C. to about 27° C. (room temperature). The first high temperature may be higher than the second high temperature. Here, the deposition process may be the duration between the starting providing the precursor of the metal via layer 170 (or metal line layer 190) into the deposition chamber and the stopping providing the precursor of the metal via layer 170 (or metal line layer 190).

In some other embodiments, during the deposition process of the metal line layer 190, the deposition temperature of the metal line layer 190 may be at about 25° C. to about 27° C. After the deposition process, an annealing process may be performed to recrystallize the metal line layer 190 to obtain a better crystalline quality. In some embodiments, a temperature of the annealing process may be in a range from about 50° C. to about 200° C., or may be range from about 50° C. to about 400° C. In some embodiments where the metal via layer 170 and the metal line layer 190 are formed using the method described herein, the deposition temperature of the metal via layer 170 and the deposition temperature of the metal line layer 190 may be substantially the same, such as about 25° C. to about 27° C. However, the temperature for annealing the metal via layer 170 may be higher than the temperature for annealing the metal line layer 190.

In some embodiments where the metal via layer 170 is formed at a higher deposition temperature than the metal line layer 190. The grain size of the metal via layer 170 (e.g., FIG. 12C) may be larger than the grain size of the metal line layer 190 (e.g., FIG. 12B). Furthermore, more separated grain clusters can be obtained in the metal via layer 170 (e.g., FIG. 12C) than in the metal line layer 190 (e.g., FIG. 12B).

Reference is made to FIG. 18. A chemical mechanism polishing (CMP) process is performed to remove excess materials of the 2-D material layer 185 and the metal line layer 190 (see FIG. 17). After the CMP process, the top surface of the IMD layer 180 is exposed. The remaining portions of the metal line layer 190 form individual metal lines 192, with 2-D material layer 185 cupping sidewalls and bottom surface of each metal line 192. In some embodiments where the 2-D material layer 185 is made of a transition metal dichacogenide (TMD) material, such as molybdenum disulfide ($MoS_2$), tungsten disulfide ($WS_2$), tungsten diselenide ($WSe_2$), the 2-D material layer 185 can act as a diffusion barrier layer. On the other hand, if the 2-D material layer 185 is made of a conductive material, such as graphene, aluminum (Al), silver (Ag), germanium (Ge), tin (Sn), tungsten (W), gold (Au), platinum (Pt), or other suitable conductive materials, the 2-D material layer 185 and the metal line 192 can collectively act as a metal line structure in the IMD layer 180.

After the CMP process, the etch stop layer 155, the IMD layer 160, the 2-D material layer 165, the metal vias 172, the etch stop layer 175, the IMD layer 180, the 2-D material layer 185, and metal lines 192 can be collectively referred to as an interconnect structure 195. Formation of the interconnect structure 195 can be referred to as a back-end-of-line (BEOL) process.

FIGS. 19 to 22 are cross-sectional views of an integrated circuit structure in various stages of fabrication in accordance with some embodiments of the present disclosure. It is noted that some elements of FIGS. 19 to 22 are similar to those described in FIGS. 1 to 18, such elements are labeled the same, and relevant details will not be repeated for simplicity.

Figure 19:
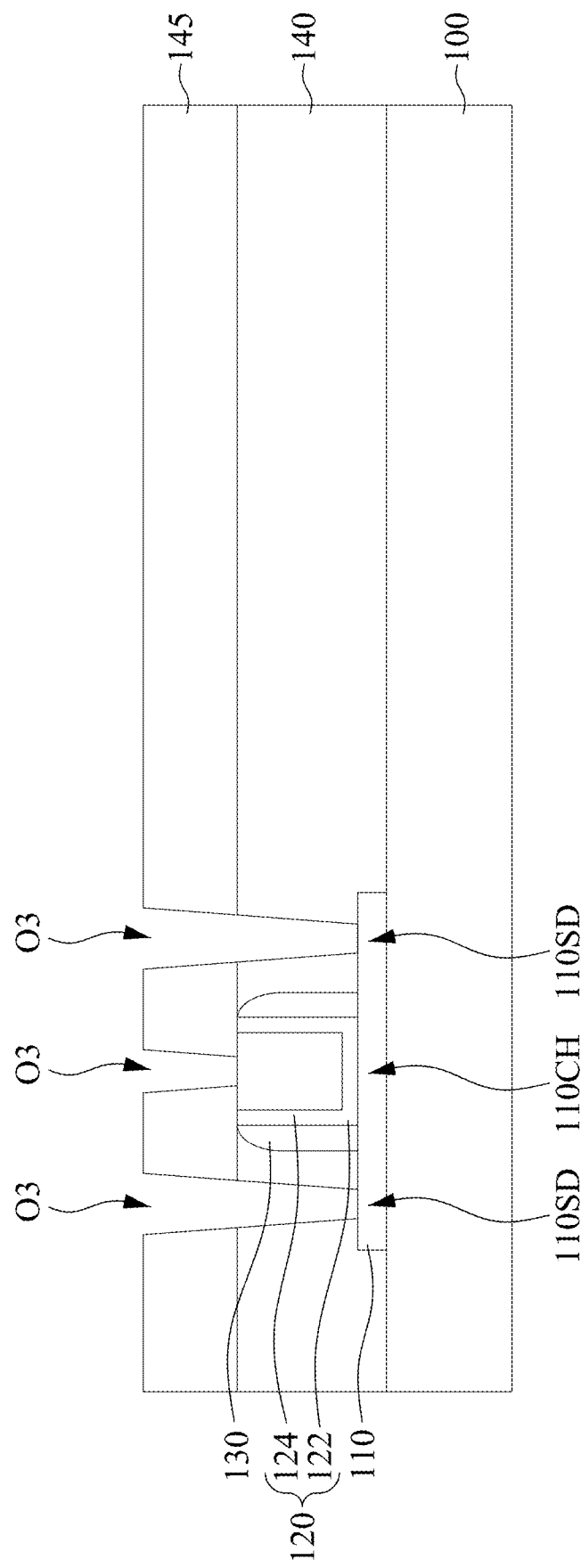
FIGS. 19-22 are cross-sectional views of an integrated circuit structure in various stages of fabrication in accordance with some embodiments of the present disclosure.

Reference is made to FIG. 19. An etching process is performed to the structure of FIG. 2, so as to form openings O3 in the second ILD layer 145 and the first ILD layer 140. In some embodiments, the openings O3 expose the source/drain regions 110SD of the 2-D material layer 110 and the gate structure 120.

Figure 20:
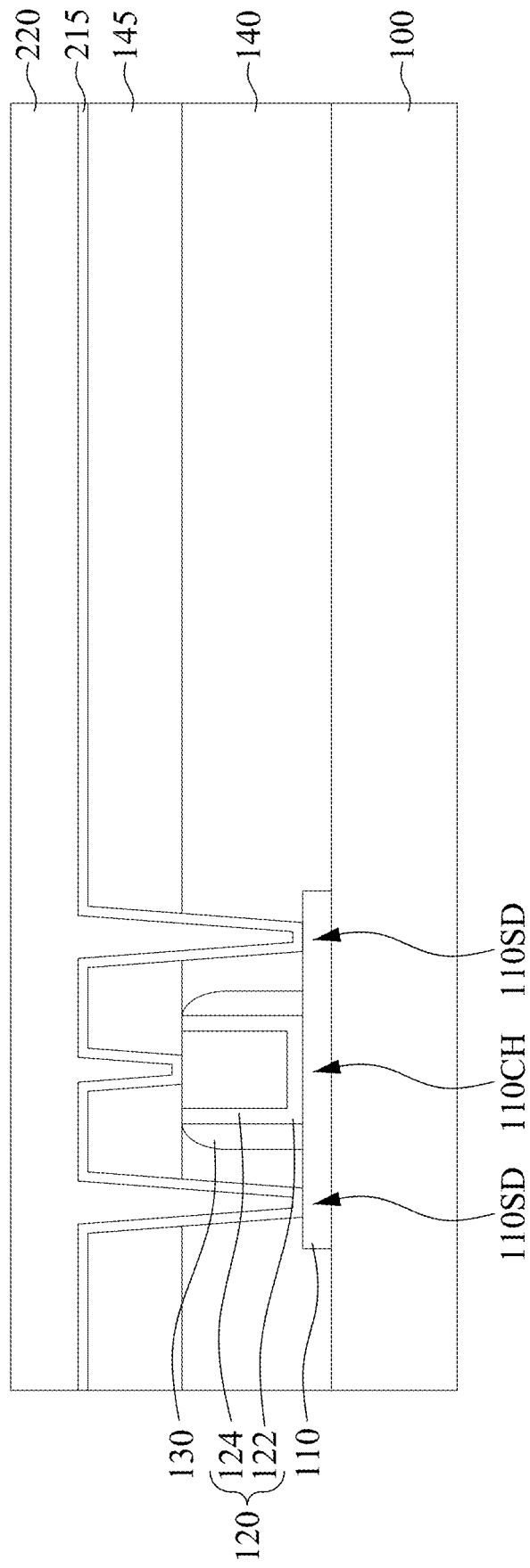

Reference is made to FIG. 20. A 2-D material layer 215 is formed lining the openings O3 in the second ILD layer 145 and the first ILD layer 140, and lining the top surfaces of source/drain regions 110SD of the 2-D material layer 110 and the gate structure 120. In some embodiments, the 2-D material layer 185 is in contact with the metal vias 172 and top ends of the 2-D material layer 165. In some embodiments, the materials and the formation method of the 2-D material layer 185 may be similar to those of the 2-D material layer 185 as described in FIG. 6A, and thus relevant details will not be repeated for simplicity.

A contact layer 220 is formed over the 2-D material layer 215. In some embodiments, the contact layer 220 may be gold (Au), silver (Ag), platinum (Pt), tungsten (W), copper (Cu), or other suitable metals. In some embodiments, the contact layer 220 may be deposited using thermal evaporation, molecular beam epitaxy (MBE), e-gun evaporation, sputtering, or other suitable deposition methods. In some embodiments, the contact layer 220 may include single-crystal structure instead of poly-crystal structure. This is because the contact layer 220 is formed on a 2-D material surface (e.g., the 2-D material layer 215). In some embodiments, the formation method and structural details of the contact layer 220 may be similar to those of the metal via layer 170 as discussed in FIGS. 7, 8A, 8B, 9A, 9B, 10, 11, 12A, 12B, and 12C, and thus relevant details will not be repeated for simplicity.

Reference is made to FIGS. 17 and 20, in which the growth conditions of the metal line layer 190 (see FIG. 17) and the contact layer 220 are discussed herein. It is noted that portions of the contact layer 220 will serve as contacts (see FIG. 22). Here, the term "contact" may be a conductive structure having longest dimension extending vertically, and a contact is used to conduct current vertically and is used to electrically connect two conductive features located at vertically adjacent levels, such as to connect the source/drain regions 110SD of the 2-D material layer 110 to the interconnect structure 195 (see FIG. 22), or to connect the gate structure 120 to the interconnect structure 195. As mentioned above, although the increasing deposition temperature of a metal film over a 2-D material surface will improve the crystalline quality, separated grain clusters may also be obtained with increasing deposition temperature (e.g., at about 200° C. as shown in FIG. 12C), in which the separated grain clusters would adversely affect laterally electrical connection. However, the separated clusters obtained at higher deposition temperature may be adopted to the contact layer 220, because the contact layer 220 will be used as a vertical connection purpose.

In some embodiments, the deposition temperature of the contact layer 220 over the 2-D material layer 215 may be in a range from about 25° C. to about 400° C. In some embodiments, the deposition temperature of the metal line layer 190 over the 2-D material layer 185 may be equal to or lower than the deposition temperature of the contact layer 220 over the 2-D material layer 215. For example, when the contact layer 220 and the metal line layer 190 are made of gold (Au), the deposition temperatures of the contact layer 220 and the metal line layer 190 may be both in a range from about 90° C. to about 110° C., such as 100° C. Alternatively, the deposition temperatures of the contact layer 220 may be in a range from about 190° C. to about 210° C., such as 200° C., while the deposition temperatures of the metal line layer 190 may be in a range from about 90° C. to about 110° C., such as 100° C.

In some embodiments, during the deposition process of the contact layer 220, the contact layer 220 may include varied deposition temperature. For example, during deposition process of the contact layer 220, the temperature may increase from a low temperature to a high temperature, and then decreases from the high temperature to the low temperature. In some embodiments, the low temperature may be about 25° C. to about 27° C. (room temperature). The high temperature may be in a range from about 50° C. to about 200° C. In some embodiments, the high temperature may be in a range from about 50° C. to about 400° C. In some embodiments where the contact layer 220 and the metal line layer 190 are formed using the method described herein, during deposition process of the contact layer 220, the temperature may increase from a first low temperature to a first high temperature, and then decreases from the first high temperature to the first low temperature. On the other hand, during the deposition process of the metal line layer 190, the temperature may increase from a second low temperature to a second high temperature, and then decreases from the second high temperature to the second low temperature. In some embodiments, the first low temperature may be substantially equal to the second low temperature, such as about 25° C. to about 27° C. (room temperature). The first high temperature may be higher than the second high temperature. Here, the deposition process may be the duration between the starting providing the precursor of the contact layer 220 (or metal via layer 170) into the deposition chamber and the stopping providing the precursor of the contact layer 220 (or metal via layer 170).

In some other embodiments, during the deposition process of the contact layer 220, the deposition temperature of the metal line layer 190 may be at about 25° C. to about 27° C. After the deposition process, an annealing process may be performed to recrystallize the contact layer 220 to obtain a better crystalline quality. In some embodiments, a temperature of the annealing process may be in a range from about 50° C. to about 200° C., or may be range from about 50° C. to about 400° C. In some embodiments where the contact layer 220 and the metal line layer 190 are formed using the method described herein, the deposition temperature of the contact layer 220 and the deposition temperature of the metal line layer 190 may be substantially the same, such as about 25° C. to about 27° C. However, the temperature for annealing the contact layer 220 may be higher than the temperature for annealing the metal line layer 190.

In some embodiments where the contact layer 220 is formed at a higher deposition temperature than the metal line layer 190. The grain size of the contact layer 220 (e.g., FIG. 12C) may be larger than the grain size of the metal line layer 190 (e.g., FIG. 12B). Furthermore, more separated grain clusters can be obtained in the contact layer 220 (e.g., FIG. 12C) than in the metal line layer 190 (e.g., FIG. 12B).

Figure 21:
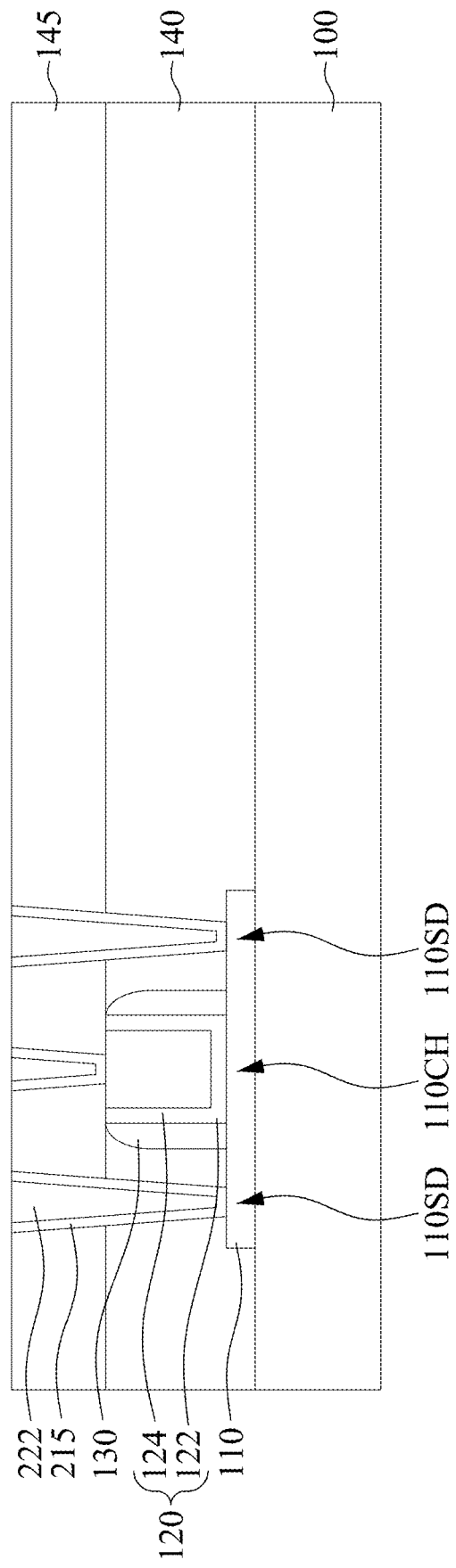

Reference is made to FIG. 21. A chemical mechanism polishing (CMP) process is performed to remove excess materials of the 2-D material layer 215 and the contact layer 220 (see FIG. 20). After the CMP process, the top surface of the second ILD layer 145 is exposed. The remaining portions of the contact layer 220 form individual contacts 222, with 2-D material layer 215 cupping sidewalls and bottom surface of each contact 222. In some embodiments where the 2-D material layer 215 is made of a transition metal dichacogenide (TMD) material, such as molybdenum disulfide (MoS$_2$), tungsten disulfide (WS$_2$), tungsten diselenide (WSe$_2$), the 2-D material layer 215 can act as a diffusion barrier layer. On the other hand, if the 2-D material layer 215 is made of a conductive material, such as graphene, aluminum (Al), silver (Ag), germanium (Ge), tin (Sn), tungsten (W), gold (Au), platinum (Pt), or other suitable conductive materials, the 2-D material layer 215 and the contact 222 can collectively act as a contact structure.

Figure 22:
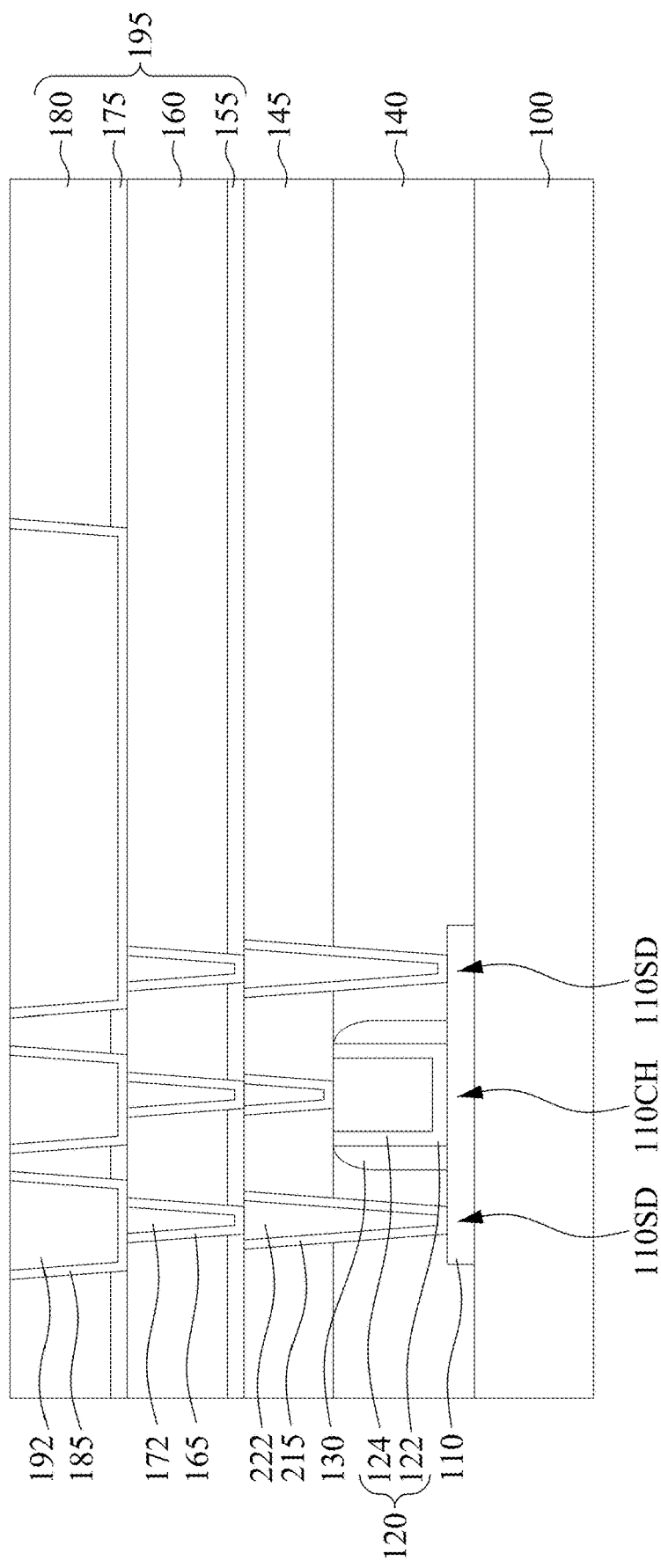

Reference is made to FIG. 22. An interconnect structure 195 is formed over the second ILD layer 145. The formation of the interconnect structure 195 is similar to those described in FIGS. 4 to 18, and thus relevant details will not be repeated for simplicity. In some embodiments, the 2-D material layer 165 is formed in contact with the contacts 222 and top ends of the 2-D material layer 215.

FIGS. 23 to 26 are cross-sectional views of an integrated circuit structure in various stages of fabrication in accordance with some embodiments of the present disclosure. It is noted that some elements of FIGS. 23 to 26 are similar to those described in FIGS. 1A to 18, such elements are labeled the same, and relevant details will not be repeated for simplicity.

Figure 23:
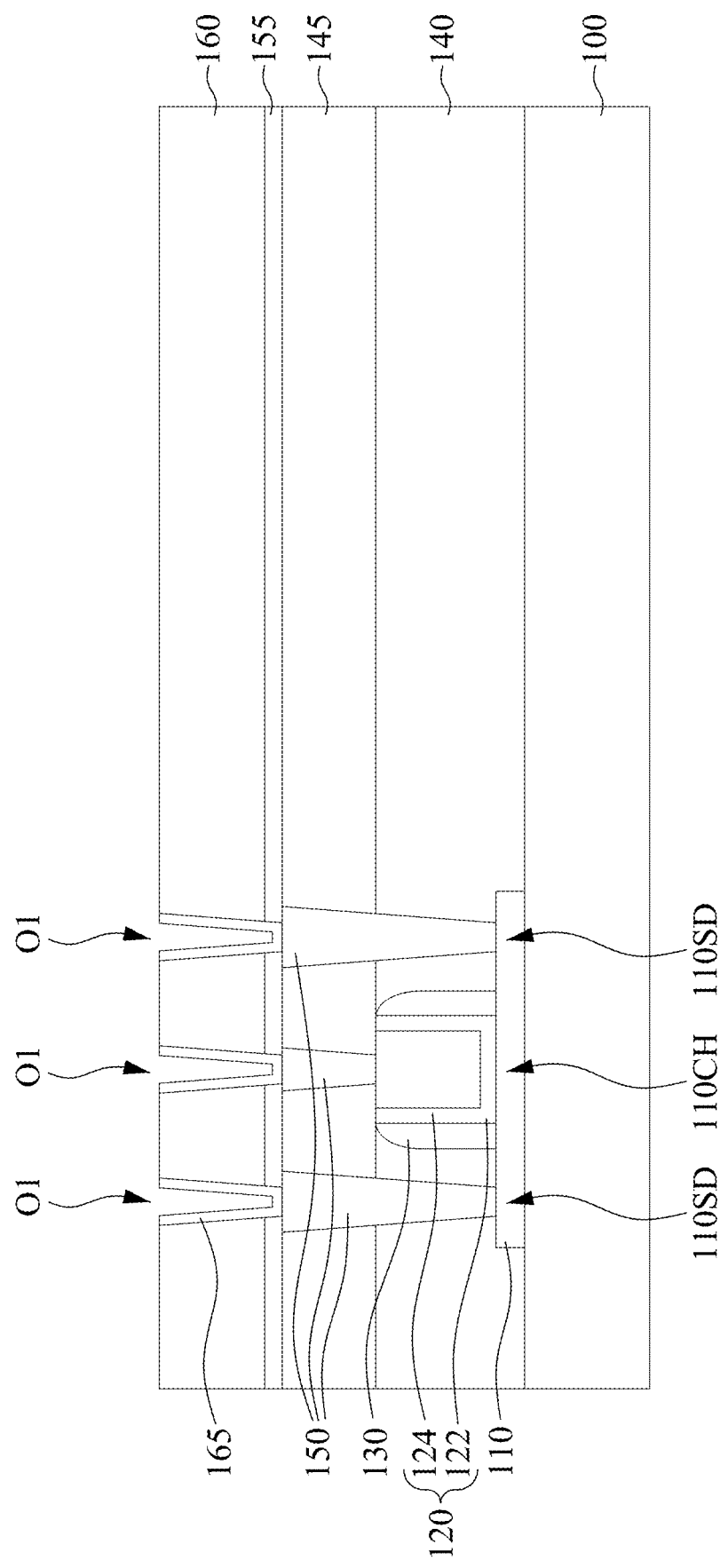
FIGS. 23-28 are cross-sectional views of an integrated circuit structure in various stages of fabrication in accordance with some embodiments of the present disclosure.

Reference is made to FIG. 23. FIG. 23 is similar to FIG. 6A, the difference between FIG. 23 and FIG. 6A is that the 2-D material layer 165 of FIG. 23 lines the openings O1 in the IMD layer 160 and the etch stop layer 155, while the top surface of the IMD layer 160 is free from coverage by the 2-D material layer 165. In some embodiments, this can be done by, for example, patterning the 2-D material layer 165 of FIG. 7 to remove portions of the 2-D material layer 165 from top surface of the IMD layer 160. In some other embodiment where the 2-D material layer 165 is formed by micromechanical exfoliation, the 2-D material layer 165 may be formed on another substrate, the 2-D material layer 165 is patterned, and then the patterned 2-D material layer 165 is transferred to the openings O1 in the IMD layer 160.

Figure 24:
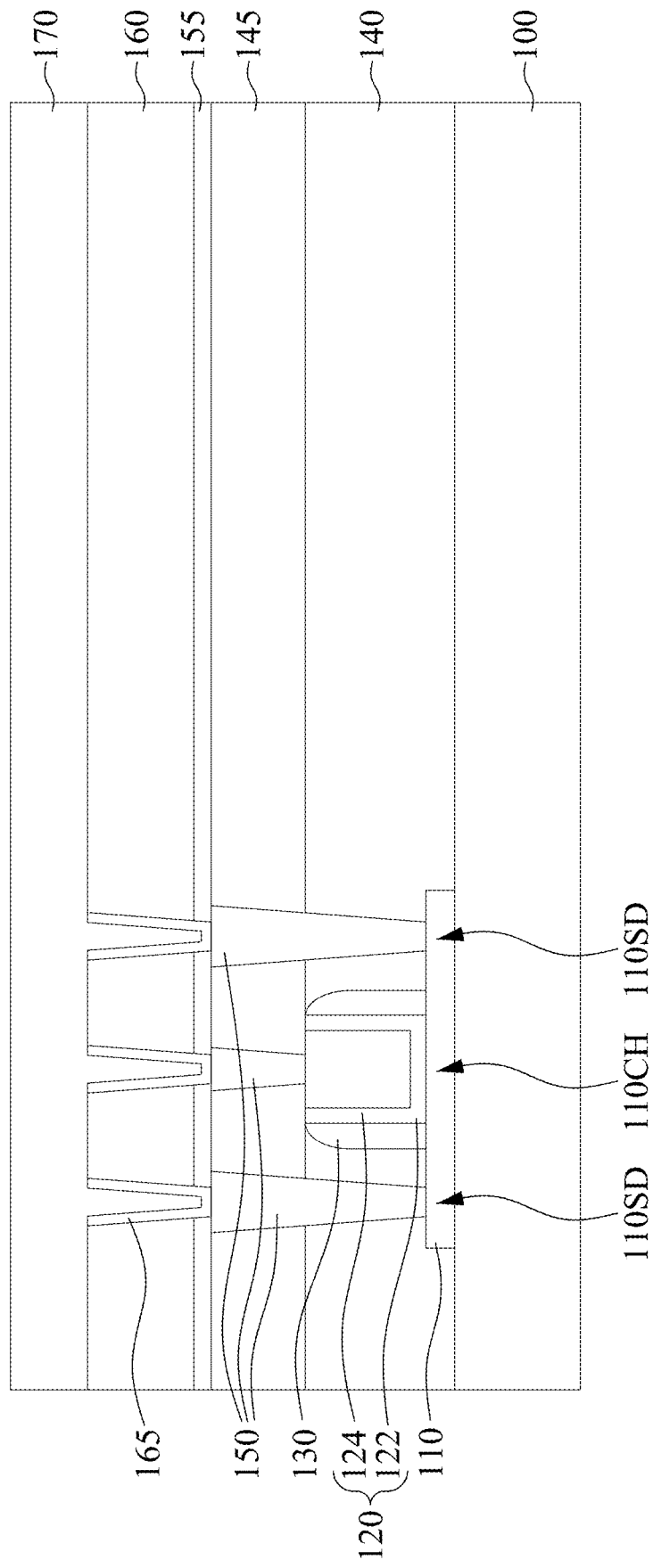

Reference is made to FIG. 24. The metal via layer 170 is formed over the IMD layer 160 and over the 2-D material layer 165. In some embodiments, the metal via layer 170 is in contact with the top surface of the IMD layer 160.

Figure 25:

Reference is made to FIG. 25. A chemical mechanism polishing (CMP) process is performed to remove excess materials of the 2-D material layer 165 and the metal via layer 170 (see FIG. 24). After the CMP process, the top surface of the IMD layer 160 is exposed. The remaining portions of the metal via layer 170 form individual metal vias 172, with 2-D material layer 165 cupping sidewalls and bottom surface of each metal via 172.

Figure 26:
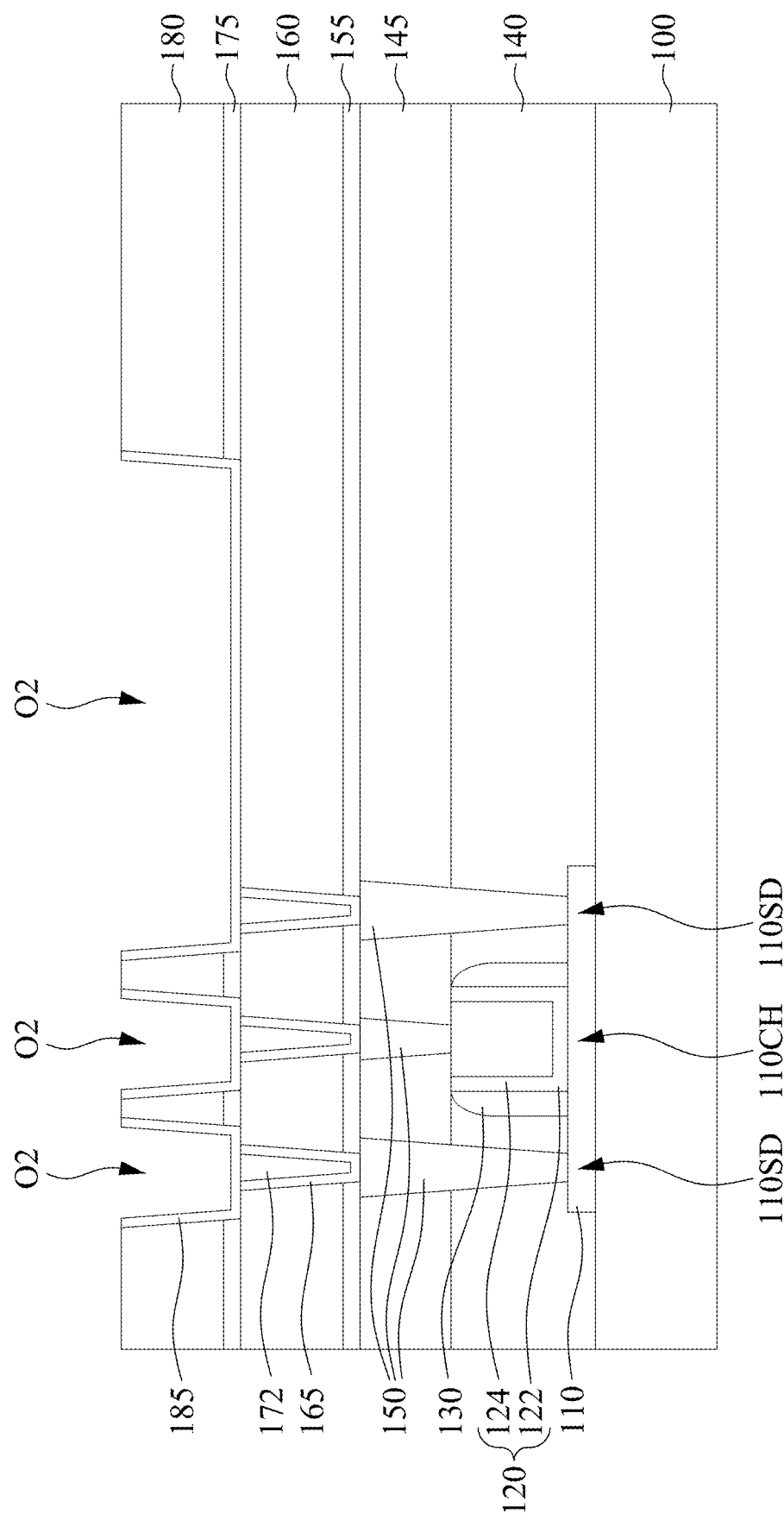

Reference is made to FIG. 26. FIG. 26 is similar to FIG. 16, the difference between FIG. 25 and FIG. 16 is that the 2-D material layer 185 of FIG. 26 lines the openings O2 in the IMD layer 180 and the etch stop layer 175, while the top surface of the IMD layer 180 is free from coverage by the 2-D material layer 185. In some embodiments, this can be done by, for example, patterning the 2-D material layer 185 of FIG. 16 to remove portions of the 2-D material layer 185 from top surface of the IMD layer 180. In some other embodiment where the 2-D material layer 185 is formed by micromechanical exfoliation, the 2-D material layer 185 may be formed on another substrate, the 2-D material layer 185 is patterned, and then the patterned 2-D material layer 185 is transferred to the openings O2 in the IMD layer 180.

Figure 27:
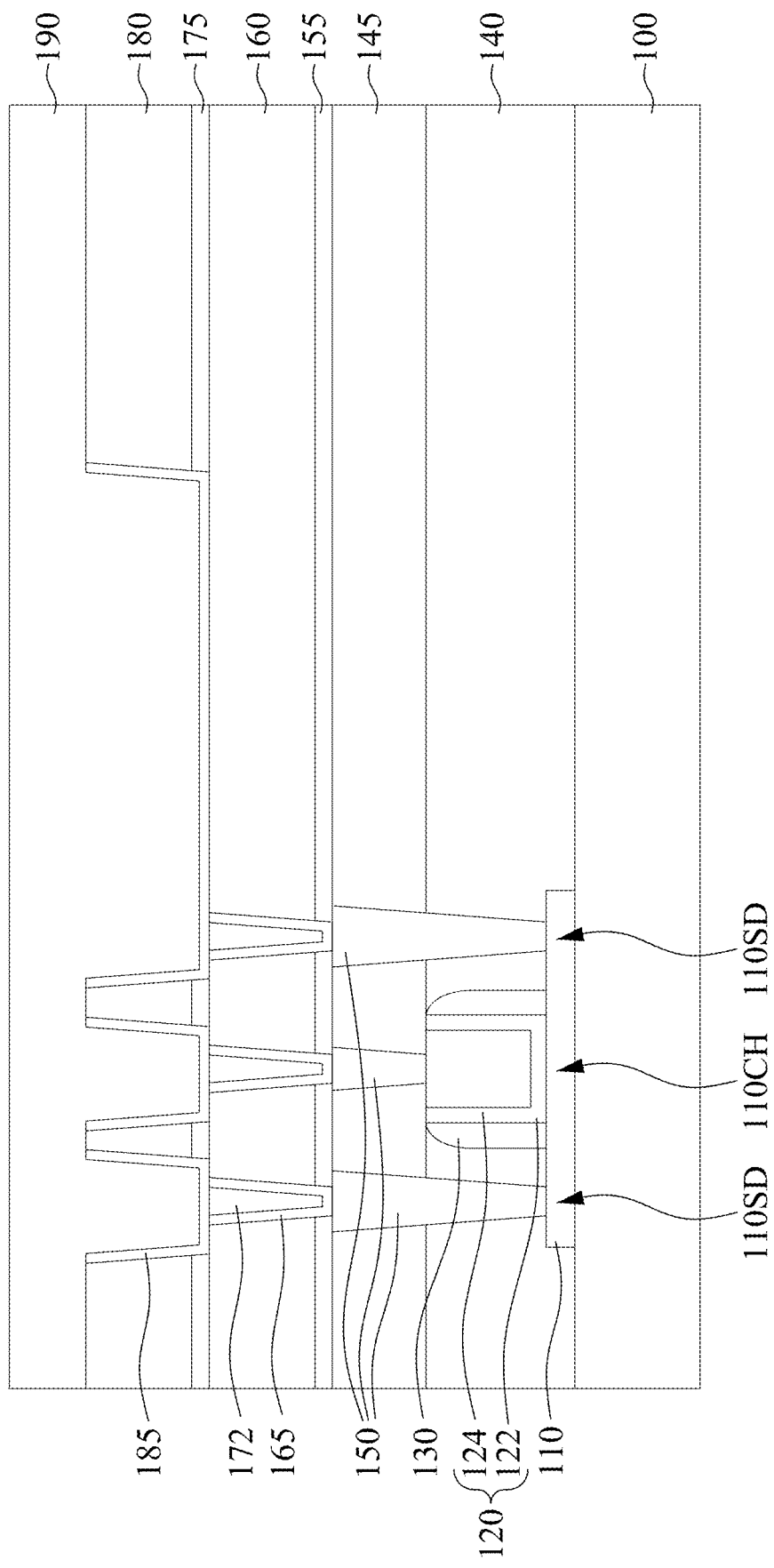

Reference is made to FIG. 27. The metal line layer 190 is formed over the IMD layer 180 and over the 2-D material layer 185. In some embodiments, the metal line layer 190 is in contact with the top surface of the IMD layer 180.

Figure 28:
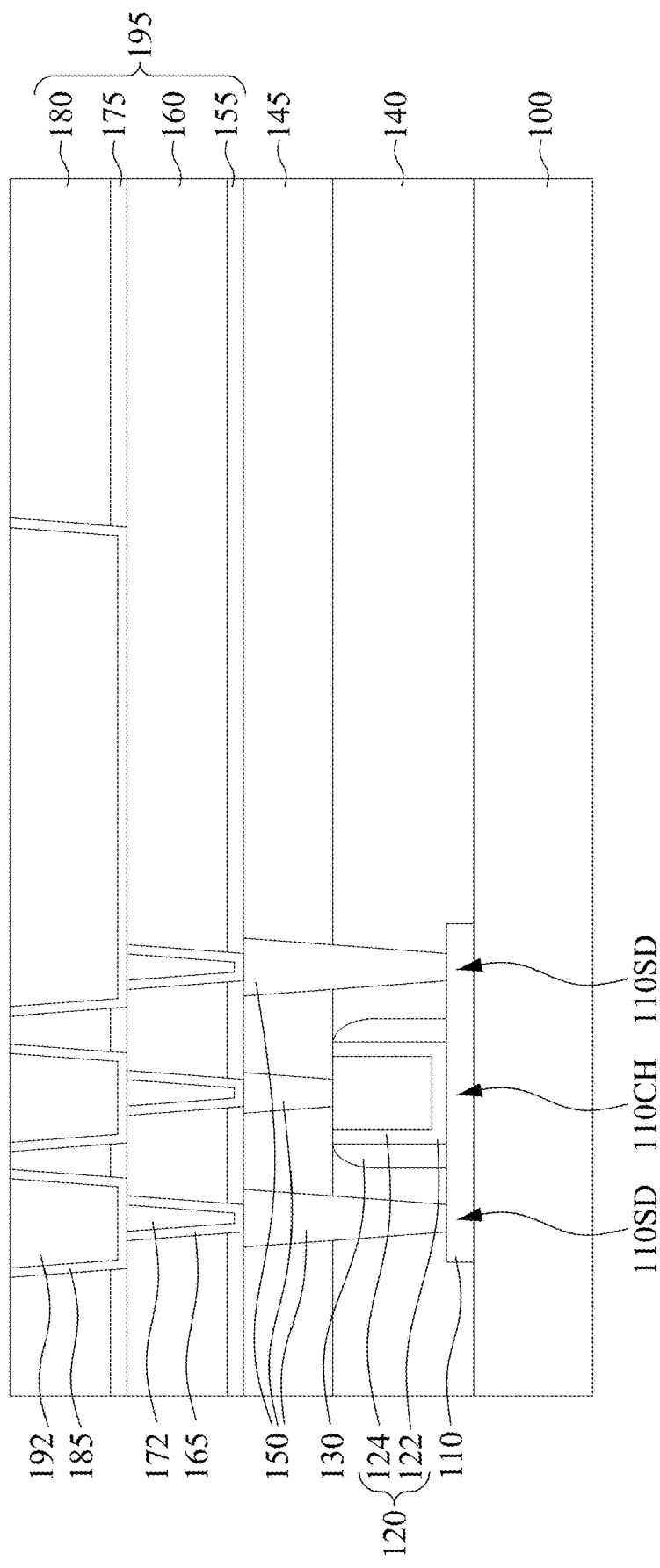

Reference is made to FIG. 28. A chemical mechanism polishing (CMP) process is performed to remove excess materials of the 2-D material layer 185 and the metal line layer 190 (see FIG. 27). After the CMP process, the top surface of the IMD layer 180 is exposed. The remaining portions of the metal line layer 190 form individual metal lines 192, with 2-D material layer 185 cupping sidewalls and bottom surface of each metal line 192.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. One advantage is that by depositing a metal layer over a 2-D material surface, the metal layer can be connected to the 2-D material surface via van der Waals force and has superior crystalline quality. Furthermore, single-crystal metal, such as Au, Ag and Cu can be obtained on a 2-D material surface. Another advantage is that, due to the improved crystalline quality, lower contact resistance is obtained by using single-crystal metal. Yet another advantage is that, low sheet resistance can be obtained for the metal film with ultra-thin thicknesses (e.g., <10 nm), which is beneficial for interconnect applications.

In some embodiments of the present disclosure, an integrated circuit includes a substrate, a transistor over the substrate, a first inter-metal dielectric (IMD) layer over the transistor, a metal via in the first IMD layer, a first 2-D material layer cupping an underside of the metal via, a second IMD layer over the metal via, a metal line in the second IMD layer, and a second 2-D material layer cupping an underside of the metal line. The second 2-D material layer span across the metal via and the first 2-D material layer. In some embodiments, wherein top ends of the first 2-D material layer are in contact with a bottom surface the second 2-D material layer. In some embodiments, wherein the second 2-D material layer is in contact with a top surface of the metal via. In some embodiments, wherein the metal via and the metal line have a single-crystal structure. In some embodiments, the IC structure further includes a gate contact on a gate of the transistor, and a third 2-D material layer cupping an underside of the gate contact. In some embodiments, the IC structure further includes source/drain contacts on source/drain regions of the transistor, respectively, and third 2-D material layers cupping undersides of the source/drain contacts, respectively. In some embodiments, wherein a grain size of the metal via is larger than a grain size of the metal line. In some embodiments, wherein the metal via has more grain clusters than the metal line. In some embodiments, wherein the first 2-D material layer is made of a single-element metal or transition metal dichacogenide.

In some embodiments of the present disclosure, an integrated circuit includes a substrate, a transistor over the substrate, a first IMD layer over the transistor, a metal via in the first IMD layer and electrically connected to the transistor, a first barrier layer lining the metal via, a second IMD layer over the first IMD layer, a metal line in the second IMD layer and over the metal via; and a second barrier layer lining the metal line, wherein a grain size of the metal via is larger than a grain size of the metal line. In some embodiments, wherein the first barrier layer and the second barrier layer are made of 2-D materials. In some embodiments, wherein the metal via have more grain clusters than the metal line. In some embodiments, the IC structure further includes an interlayer dielectric (ILD) layer over the transistor and below the first IMD layer, a gate contact extending through the ILD layer to a gate structure of the transistor, and a third barrier layer lining the gate contact. In some embodiments, wherein the gate contact has a top surface in contact with the first barrier layer. In some embodiments, wherein the third barrier layer is made of a 2-D material.

In some embodiments of the present disclosure, a method includes forming a transistor over a substrate; forming an interlayer dielectric (ILD) layer over the transistor; forming a first inter-metal dielectric (IMD) layer over the ILD layer; etching a via opening extending through the first IMD layer; forming a first 2-D material layer lining the via opening; depositing a first metal in the via opening and over the first 2-D material layer; and performing a chemical mechanism polishing (CMP) process to the metal until the first IMD layer is exposed. In some embodiments, wherein the first metal is deposited on a surface of the first IMD layer. In some embodiments, wherein during depositing the first metal, a temperature increases from a first temperature to a second temperature higher than the first temperature, and then decreases from the second temperature back to the first temperature. In some embodiments, the method further includes performing an annealing process after depositing the first metal. In some embodiments, the method further includes forming a second IMD layer over the first IMD layer; etching a trench in the second IMD layer; forming a second 2-D material layer lining the trench; and depositing a second metal over the second 2-D material layer at a temperature lower than a temperature of depositing the first metal over the first 2-D material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a transistor over a substrate;
   forming an interlayer dielectric (ILD) layer over the transistor;
   forming a first inter-metal dielectric (IMD) layer over the ILD layer;
   etching a via opening extending through the first IMD layer;
   forming a first 2-D material layer lining along sides and a bottom of the via opening;
   depositing a first metal in the via opening and over the first 2-D material layer;
   performing a chemical mechanism polishing (CMP) process to the first metal until the first IMD layer is exposed;
   forming a second IMD layer over the first IMD layer;
   etching a trench in the second IMD layer;
   forming a second 2-D material layer lining along sides and a bottom of the trench; and
   depositing a second metal over the second 2-D material layer at a temperature lower than a temperature of depositing the first metal over the first 2-D material layer.

2. The method of claim 1, wherein the first 2-D material layer is deposited on a surface of the first IMD layer.

3. The method of claim 1, wherein during depositing the first metal, a temperature increases from a first temperature to a second temperature higher than the first temperature, and then decreases from the second temperature back to the first temperature.

4. The method of claim 1, further comprising performing an annealing process after depositing the first metal.

5. The method of claim 1, wherein a grain size of the first metal is larger than a grain size of the second metal.

6. The method of claim 1, wherein the first metal has more grain clusters than the second metal.

7. A method, comprising:
   forming a transistor over a substrate;

forming a first inter-metal dielectric (IMD) layer over the transistor;
forming a first 2-D material layer in the first IMD layer;
forming a metal via in the first IMD layer and over the first 2-D material layer;
forming a second IMD layer over the metal via;
forming a second 2-D material layer in the second IMD layer, wherein the second 2-D material layer spans across the metal via and the first 2-D material layer; and
forming a metal line in the second IMD layer and over the second 2-D material layer, wherein the metal via has more grain clusters than the metal line.

8. The method of claim 7, wherein top ends of the first 2-D material layer are in contact with a bottom surface the second 2-D material layer.

9. The method of claim 7, wherein the second 2-D material layer is in contact with a top surface of the metal via.

10. The method of claim 7, wherein the metal via and the metal line have a single-crystal structure.

11. The method of claim 7, further comprising forming a gate contact over a gate of the transistor and a third 2-D material layer cupping an underside of the gate contact.

12. The method of claim 7, further comprising forming a source/drain contact electrically connected with a source/drain region of the transistor and a third 2-D material layer cupping an underside of the source/drain contact.

13. The method of claim 7, wherein a grain size of the metal via is larger than a grain size of the metal line.

14. The method of claim 7, wherein the first 2-D material layer is made of a single-element metal or transition metal dichalcogenide.

15. A method, comprising:
forming a transistor over a substrate;
forming a first IMD layer over the transistor;
forming a first barrier layer in the first IMD layer and electrically connected to the transistor;
forming a metal via in the first IMD layer and over the first barrier layer;
forming a second IMD layer over the first IMD layer;
forming a second barrier layer in the second IMD and over the metal via; and
forming a metal line in the second IMD layer and over the second barrier layer, wherein a grain size of the metal via is larger than a grain size of the metal line.

16. The method of claim 15, wherein the first barrier layer and the second barrier layer are made of 2-D materials.

17. The method of claim 15, wherein the metal via has more grain clusters than the metal line.

18. The method of claim 15, further comprising:
forming an interlayer dielectric (ILD) layer over the transistor;
forming a third barrier layer in the ILD layer and electrically connected with a gate structure of the transistor; and
forming a gate contact in the ILD layer and over the third barrier layer.

19. The method of claim 18, wherein the gate contact has a top surface in contact with the first barrier layer.

20. The method of claim 18, wherein the third barrier layer is made of a 2-D material.

* * * * *